United States Patent
Sze et al.

(10) Patent No.: US 11,063,081 B2
(45) Date of Patent: Jul. 13, 2021

(54) DEVICE OVER PHOTODETECTOR PIXEL SENSOR

(71) Applicant: Taiwan Semiconductor Manufacturing Co., Ltd., Hsin-Chu (TW)

(72) Inventors: Jhy-Jyi Sze, Hsin-Chu (TW); Dun-Nian Yaung, Taipei (TW); Alexander Kalnitsky, San Francisco, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 128 days.

(21) Appl. No.: 16/402,633

(22) Filed: May 3, 2019

(65) Prior Publication Data

US 2020/0176500 A1 Jun. 4, 2020

Related U.S. Application Data

(60) Provisional application No. 62/772,749, filed on Nov. 29, 2018.

(51) Int. Cl.
*H01L 27/146* (2006.01)
*H01L 21/762* (2006.01)
(Continued)

(52) U.S. Cl.
CPC .. *H01L 27/14632* (2013.01); *H01L 21/76256* (2013.01); *H01L 27/1463* (2013.01);
(Continued)

(58) Field of Classification Search
CPC combination set(s) only.
See application file for complete search history.

(56) References Cited

U.S. PATENT DOCUMENTS

| 6,372,537 B1* | 4/2002 | Lee | H01L 27/14609 257/E27.132 |
|---|---|---|---|
| 2006/0278926 A1 | 12/2006 | Mathew et al. | |

(Continued)

FOREIGN PATENT DOCUMENTS

| JP | H07142603 A | 6/1995 |
|---|---|---|
| TW | 200939459 A | 9/2009 |
| WO | 2004044989 A1 | 5/2004 |

OTHER PUBLICATIONS

Stefanov, Konstantin D.; Zhang, Zhige; Damerell, Chris; Burt, David and Kar-Roy, Arjun (2013). Performance of buried channel n-type MOSFETs in 0.18-m CMOS image sensor process. In: UV, X-Ray, and Gamma-Ray Space Instrumentation for Astronomy XVIII, SPIE, article No. 8859-17. Published in 2013.

*Primary Examiner* — Hrayr A Sayadian
(74) *Attorney, Agent, or Firm* — Eschweiler & Potashnik, LLC

(57) ABSTRACT

Various embodiments of the present application are directed towards a semiconductor-on-insulator (SOI) DoP image sensor and a method for forming the SOI DoP image sensor. In some embodiments, a semiconductor substrate comprises a floating node and a collector region. A photodetector is in the semiconductor substrate and is defined in part by a collector region. A transfer transistor is over the semiconductor substrate. The collector region and the floating node respectively define source/drain regions of the transfer transistor. A semiconductor mesa is over and spaced from the semiconductor substrate. A readout transistor is on and partially defined by the semiconductor mesa. The semiconductor mesa is between the readout transistor and the semiconductor substrate. A via extends from the floating node to a gate electrode of the readout transistor.

20 Claims, 26 Drawing Sheets

(51) Int. Cl.
  *H04N 5/369*   (2011.01)
  *H04N 5/378*   (2011.01)
  *H04N 5/359*   (2011.01)

(52) U.S. Cl.
  CPC .. H01L 27/14636 (2013.01); H01L 27/14643 (2013.01); H01L 27/14687 (2013.01); H01L 27/14689 (2013.01); *H04N 5/3591* (2013.01); *H04N 5/378* (2013.01); *H04N 5/379* (2018.08)

(56) References Cited

U.S. PATENT DOCUMENTS

| | | | |
|---|---|---|---|
| 2012/0085888 A1* | 4/2012 | Endo | H01L 27/14609 |
| | | | 250/208.1 |
| 2013/0188078 A1 | 7/2013 | Shim et al. | |
| 2016/0126282 A1 | 5/2016 | Chen et al. | |
| 2017/0047370 A1 | 2/2017 | Gang et al. | |
| 2017/0358620 A1 | 12/2017 | Chen et al. | |

* cited by examiner

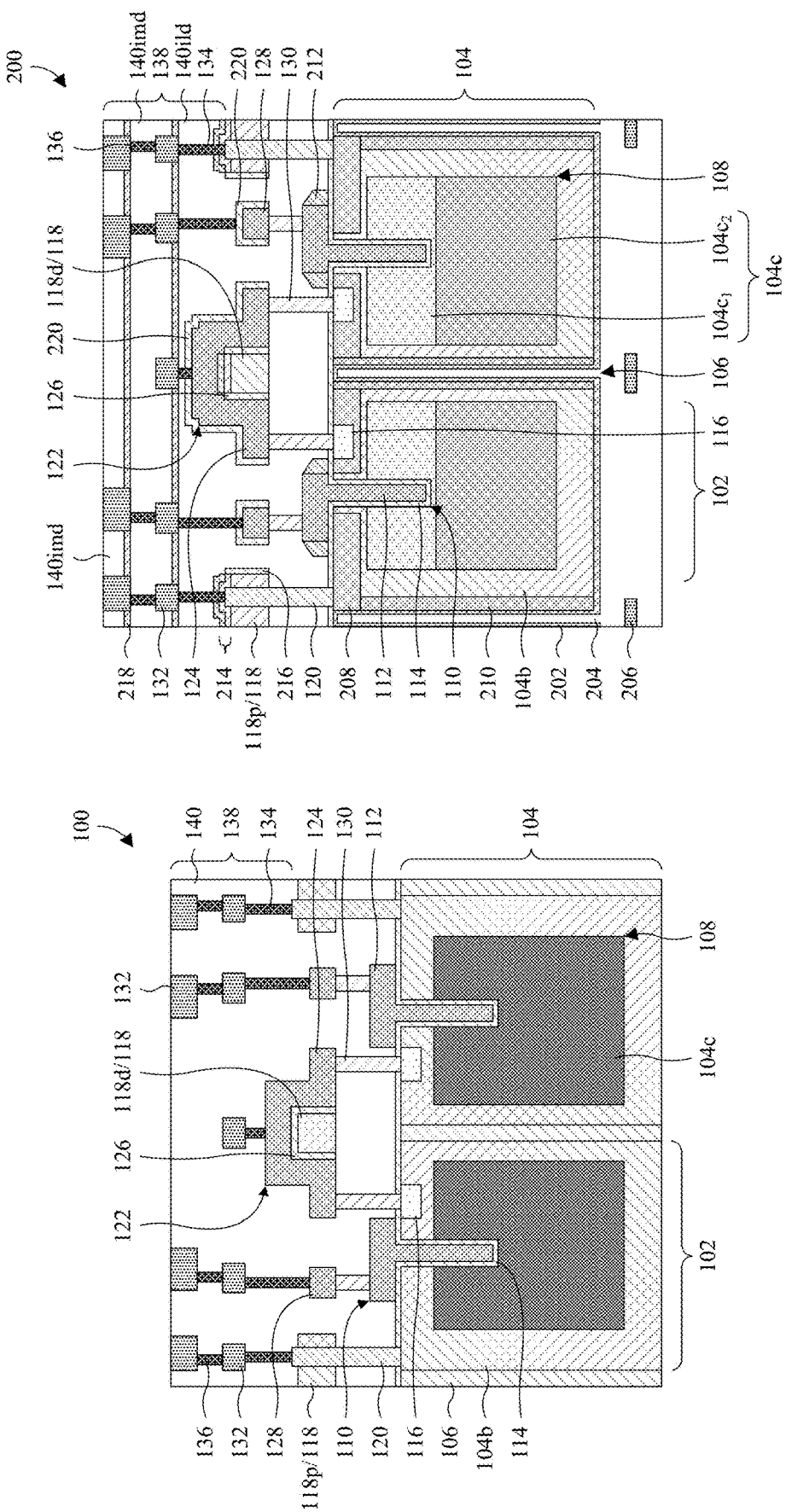

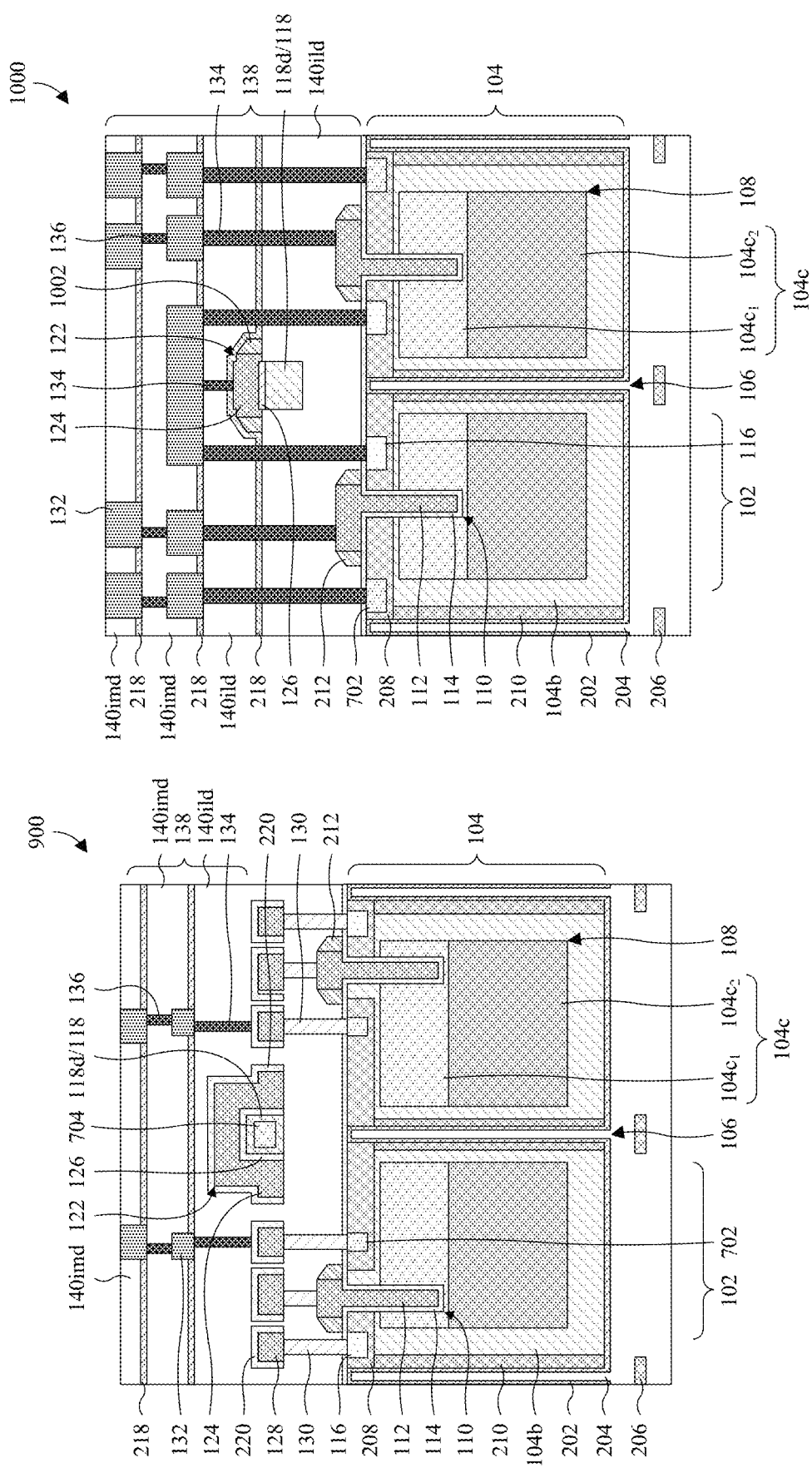

DEVICE OVER PHOTODETECTOR PIXEL SENSOR

REFERENCE TO RELATED APPLICATION

This application claims the benefit of U.S. Provisional Application No. 62/772,749, filed on Nov. 29, 2018, the contents of which are incorporated herein by reference in their entirety.

BACKGROUND

Complementary metal-oxide semiconductor (CMOS) image sensors are used in a wide range of modern-day electronic devices, such as, for example, cameras, tablets, smart phones, and so on. CMOS image sensors may be front-side illuminated (FSI) or back-side illuminated (BSI). Compared to FSI CMOS image sensors, BSI CMOS image sensors have better sensitivity, better angular response, and greater metal routing flexibility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional view of some embodiments of a semiconductor-on-insulator (SOI) device-over-photodetector (DoP) image sensor.

FIG. 2 illustrates a cross-sectional view of some more detailed embodiments of the SOI DoP image sensor of FIG. 1.

FIG. 9 illustrates a cross-sectional view of some alternative embodiments of the SOI DoP image sensor of FIG. 7 in which pickup regions are between a source-follower transistor and respective transfer transistors.

FIG. 10 illustrates a cross-sectional view of some alternative embodiments of the SOI DoP image sensor of FIG. 6 in which inter-level pads and inter-device contact vias are omitted.

DETAILED DESCRIPTION

Figures 3A, 3B:
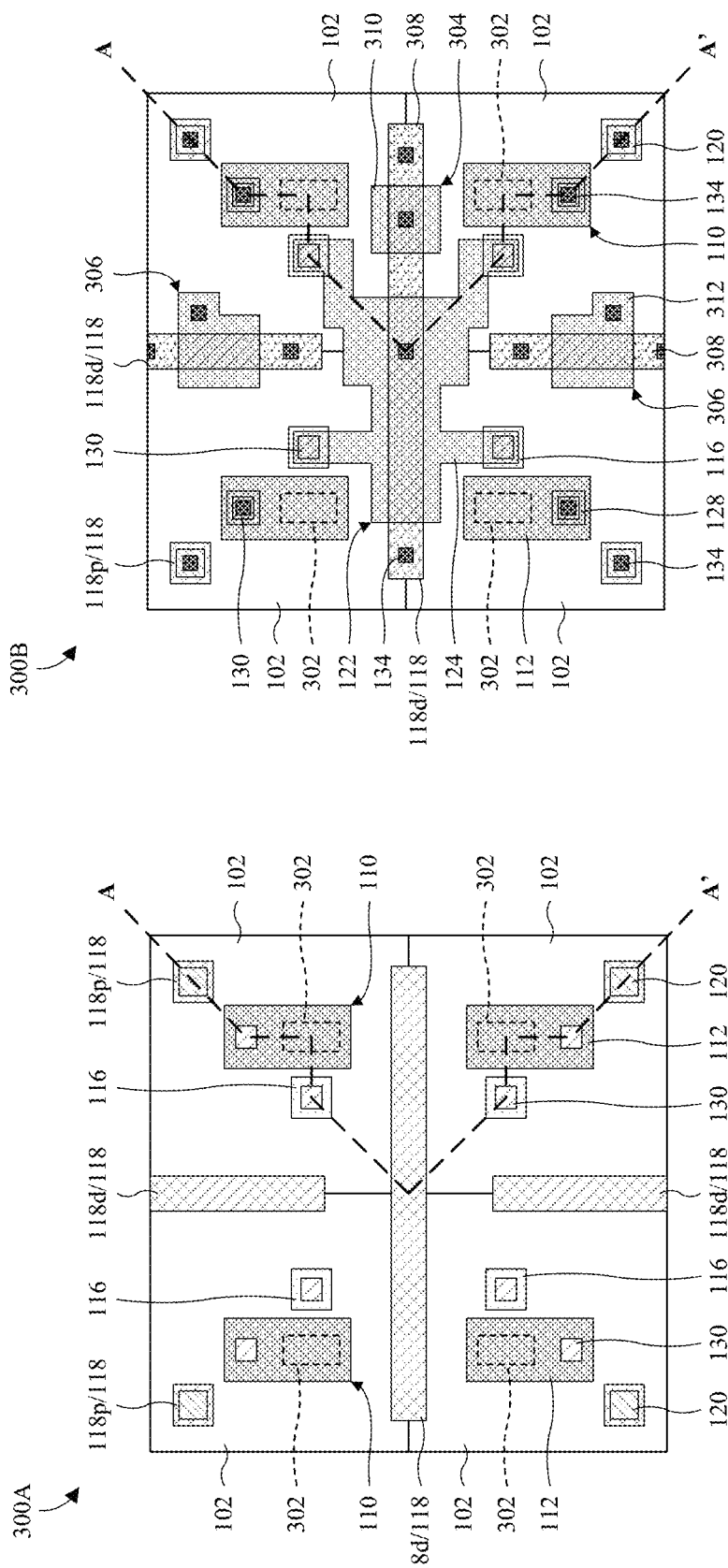
FIGS. 3A and 3B illustrate various top layouts of some embodiments of the SOI DoP image sensor of FIG. 2.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bulk-silicon device-over-photodetector (DoP) image sensor may, for example, comprise photodetectors separated by a full-depth frontside deep trench isolation (FDTI) structure or a partial-depth backside deep trench isolation (BDTI) structure. A bulk-silicon DoP image sensor with a full-depth FDTI structure may, for example, have limited silicon surface area for transfer transistors and readout transistors, limited scaling, high noise, high parasitic capacitance from a back-end-of-line (BEOL) interconnect structure, and deep vertical transfer gates. Silicon surface area for transfer and readout transistors may, for example, be limited because the full-depth FDTI structure occupies surface area that would otherwise be silicon surface area. Scaling may, for example, be limited because silicon surface area for transfer and readout transistors is limited. Noise and parasitic capacitance from the BEOL interconnect structure may, for example, be high since transfer and readout transistors are localized to a small silicon surface area. Hence, conductive features of the BEOL interconnect structure that electrically couple with the transfer and readout transistors are localized to a small area. A bulk silicon DoP image sensor with a partial-depth BDTI structure may, for example, have low optical isolation between photodetectors, low cross talk, low electrical isolation between photodetectors, low full well capacity (FWC), low anti-blooming, and deep vertical transfer gates. Optical and electrical isolation may, for example, be low because the partial-depth BDTI structure is partial depth. Cross talk may, for example, be high because of the low optical isolation. FWC and hence anti-blooming may, for example, be low because of the low electrical isolation.

Various embodiments of the present application are directed towards a semiconductor-on-insulator (SOI) DoP image sensor and a method for forming the SOI DoP image sensor. In some embodiments, the SOI DoP image sensor comprises a semiconductor substrate, a plurality of photodetectors, a plurality of transfer transistors, a semiconductor mesa, and a readout transistor. The plurality of photodetectors is in the semiconductor substrate. The transfer transistors are on a frontside of the semiconductor substrate, respectively at the photodetectors, and comprise individual transfer gates. The readout transistor is on the semiconductor mesa, directly over a boundary between the plurality of photodetectors. The semiconductor mesa is spaced over the semiconductor substrate, on the frontside of the semiconductor substrate, and is between the readout transistor and the semiconductor substrate. In some embodiments, the readout transistor is a source-follower transistor and comprises a gate electrode selectively-electrically coupled to the photodetectors by the transfer transistors. In some embodiments, the SOI DoP image sensor further comprises a full-depth BDTI structure extending through an entire thickness of the semiconductor substrate, from a backside of the semiconductor substrate to the frontside of the semiconductor substrate. The full-depth BDTI structure is between the photodetectors and individually surrounds each of the photodetectors.

Because of the full-depth BDTI structure, the SOI DoP image sensor may have high optical and electrical isolation between photodetectors. The high optical isolation may lead to low cross-talk between photodetectors and a high modulation transfer function (MTF). The high electrical isolation may lead to high full well capacity (FWC) and hence high anti-blooming. Because of readout transistor sharing between the photodetectors, noise (e.g., random telegraph signal (RTS) noise and/or other suitable noise) may be low. Because the semiconductor mesa is independent of the semiconductor substrate, the readout transistor is on a different level than the transfer transistors and the photodetectors. As a result, design flexibility is enhanced. For example, reflective shallow trench isolation (STI) gratings may be employed for high near infrared (NIR) sensitivity. As another example, the readout transistor may be a junction gate field-effect transistor (JFET) and/or a full-depletion transistor. Because the readout transistor may be a JFET, noise (e.g., RTS noise and/or some other suitable noise) may be low. Further, when the readout transistor is a source-follower transistor, gain may be high. Because the readout transistor may be a full-depletion transistor, leakage and junction capacitance may be low. Hence, when the readout transistor is a source-follower transistor, leakage may be low at floating nodes to which the transfer transistors transfer charge.

With reference to FIG. 1, a cross-sectional view 100 of some embodiments of a SOI DoP image sensor comprising a plurality of pixels 102 on a substrate 104 is provided. The substrate 104 may, for example, be a bulk monocrystalline silicon substrate or some other suitable semiconductor substrate. The pixels 102 are separated by a full-depth BDTI structure 106 extending completely through the substrate 104, from a backside of the substrate 104 to a frontside of the substrate 104 opposite the backside. The pixels 102 comprise individual photodetectors 108 and individual transfer transistors 110. The full-depth BDTI structure 106 may, for example, be or comprise oxide and/or some other suitable dielectric(s).

The photodetectors 108 are in the substrate 104 and are electrically and optically isolated by the full-depth BDTI structure 106. Further, the photodetectors 108 are defined by photojunctions between a bulk region 104b of the substrate 104 and individual collector regions 104c of the substrate 104. The bulk region 104b of the substrate 104 and the collector regions 104c of the substrate 104 have opposite doping types, and the photojunctions may, for example, be PN junctions or other suitable photojunctions. The photodetectors 108 may be or comprise, for example, photodiodes or some other suitable photodetectors.

The transfer transistors 110 are individual to and respectively overlie the photodetectors 108. Further, the transfer transistors comprise individual transfer gate electrodes 112. The transfer gate electrodes 112 protrude into the collector regions 104c and are spaced over the substrate 104 by a transfer gate dielectric layer 114. The transfer gate electrodes 112 may be or comprise, for example, doped polysilicon and/or some other suitable conductive material(s). The transfer gate dielectric layers 114 may be or comprise, for example, silicon oxide and/or some others suitable dielectric(s). The transfer transistors 110 are configured to selectively electrically couple the photodetectors 108 respectively to individual floating nodes 116 of the substrate 104. The floating nodes 116 may, for example, have the same doping type as the collector regions 104c and/or an opposite doping type as the bulk region 104b.

Because of the full-depth BDTI structure 106, the SOI DoP image sensor may have high optical and electrical isolation between the photodetectors 108. The high optical isolation may lead to low cross-talk between the photodetectors 108 and a high MTF. The high electrical isolation may lead to high FWC and hence high anti-blooming.

A plurality of mesas 118 is spaced over the substrate 104 and overlies the full-depth BDTI structure 106. The mesas 118 may be or comprise, for example, monocrystalline silicon and/or some other suitable semiconductor material. The plurality of mesas 118 comprises a plurality of pickup mesas 118p and a device mesa 118d. The pickup mesas 118p are individual to and respectively overlie the photodetectors 108. Further, the pickup mesas 118p are electrically coupled to the bulk region 104b of the substrate 104 by individual pickup vias 120 extending therebetween. The pickup vias 120 may, for example, be or comprise doped monocrystalline silicon and/or some other suitable conductive material. Further, the pickup vias 120 may, for example, have the same doping type as the bulk region 104b of the substrate 104 and/or may be or comprise, for example, the same material as the bulk region 104b. The device mesa 118d supports and partially defines a source-follower transistor 122.

The source-follower transistor 122 comprises a source-follower gate electrode 124 wrapping around a top of the device mesa 118d. The source-follower gate electrode 124 is spaced from the device mesa 118d by a gate dielectric layer 126. Further, the source-follower gate electrode 124 is at a common elevation above the substrate 104 as a plurality of inter-level pads 128. The inter-level pads 128 are individual to and respectively overlie the transfer gate electrodes 112. The source-follower gate electrode 124 and/or the inter-level pads 128 may be or comprise, for example, doped polysilicon and/or some other suitable conductive material(s). The gate dielectric layer 126 may be or comprise, for example, silicon oxide and/or some others suitable dielectric(s).

A plurality of inter-device contact vias 130 are between the mesas 118 and the substrate 104. The inter-device contact vias 130 extend respectively from the transfer gate electrodes 112 respectively to the inter-level pads 128 and also respectively from the floating nodes 116 to the source-follower gate electrode 124. In some embodiments, the inter-device contact vias 130 are or comprise doped polysilicon and/or some other suitable conductive material. The doping type may, for example, be the same as the floating nodes 116, the source-follower gate electrode 124, the inter-level pads 128, or any combination of the foregoing. In some embodiments, the inter-device contact vias 130 are or comprise the same semiconductor material as the source-follower gate electrode 124 and/or as the inter-level pads 128.

Because the source-follower gate electrode 124 is electrically coupled to each of the floating nodes 116, the pixels 102 share the source-follower transistor 122. Because of such sharing, there aren't multiple source-follower transistors in close proximity and switching noise isn't being passed between the multiple source-follower transistors. Hence, noise (e.g., RTS noise and/or other suitable noise) may be low.

A plurality of wires 132, a plurality of interconnect contact vias 134, and a plurality of inter-wire vias 136 are stacked over the source-follower transistor 122 and the mesas 118 to define an interconnect structure 138. The wires 132 and/or the inter-wire vias 136 may be or comprise the same material, aluminum copper, aluminum, copper, some other suitable conductive material(s), or any combination of the foregoing. The interconnect contact vias 134 may be or comprise, for example, tungsten, copper, aluminum copper, some other suitable conductive material(s), or any combination of the foregoing.

A frontside dielectric layer 140 surrounds the wires 132, the interconnect contact vias 134, and the inter-wire vias 136, as well as the mesas 118 and other structure on the frontside of the substrate 104. The frontside dielectric layer 140 may be or comprise, for example, silicon oxide, a low k dielectric, silicon carbide, silicon nitride, some other suitable dielectric(s), or any combination of the foregoing.

Because the mesas 118 are independent of the substrate 104, the source-follower transistor 122 and other readout transistors (not shown) are on a different device level than the transfer transistors 110 and the photodetectors 108. As a result, the full-depth BDTI structure 106 does not limit semiconductor surface area for the source-follower transistor 122 and the other readout transistors. Because semiconductor surface area is not limited, scaling of the image sensor may be enhanced. Further, noise and parasitic capacitance from the interconnect structure may be low. Noise and parasitic capacitance may be low because the transfer transistors 110 and the readout transistors (e.g., the source-follower transistor 122) are spread over a larger area and hence conductive features (e.g., the interconnect contact vias 134) of the interconnect structure are spread over a larger area. Also, because semiconductor surface area is not limited, design flexibility is enhanced. For example, reflective STI gratings may be employed for high NIR sensitivity. As another example, the source-follower transistor 122 may be a JFET and/or a full-depletion transistor. Because the readout transistor may be a JFET, noise (e.g., RTS noise and/or some other suitable noise) may be low and gain may be high. Because the source-follower transistor 122 may be a full-depletion transistor, leakage and junction capacitance may be low. Hence, leakage may be low at the floating nodes 116.

With reference to FIG. 2, a cross-sectional view 200 of some more detailed embodiments of the SOI DoP image sensor of FIG. 1 is provided in which the full-depth BDTI structure 106 is defined by a backside dielectric liner 202 and a backside dielectric layer 204. The backside dielectric liner 202 lines a backside of the substrate 104 and may, for example, be or comprise a high k dielectric layer and/or some other suitable dielectric(s). The backside dielectric layer 204 covers the backside dielectric liner 202 on the backside of the substrate 104 and accommodates shielding 206. The backside dielectric layer 204 may, for example, be or comprise silicon oxide and/or some other suitable dielectric(s).

The shielding 206 prevents radiation received from a backside of the substrate 104 from impinging on the full-depth BDTI structure 106. Further, sidewalls of the shielding 206 reflect radiation received from the backside of the substrate 104 towards the photodetectors 108 to reduce cross-talk and enhance quantum efficacy of the SOI DoP image sensor. The shielding 206 includes a plurality of segments that are individual to and respectively underlie segments of the full-depth BDTI structure 106. The shielding 206 may, for example, be or comprise metal and/or some other suitable reflective material(s).

The collector regions 104c comprise individual shallow collector regions $104c_1$ and further comprise individual deep collector regions $104c_2$ respectively underlying the shallow collector regions $104c_1$. The shallow and deep collector regions $104c_1$, $104c_2$ share a common doping type but different doping concentrations. For example, the shallow collector region $104c_1$ may have a higher doping concentration than the deep collector region $104c_2$. Further, the shallow and deep collector regions $104c_1$, $104c_2$ have an opposite doping type as the bulk region 104b of the substrate 104. For example, the shallow and deep collector regions $104c_1$, $104c_2$ may be N-type and the bulk region 104b may be P-type or vice versa.

Shallow cell wells 208 and deep cell wells 210 are in the substrate 104 and are individual to the pixels 102. The shallow cell wells 208 respectively overly the collector regions 104c and respectively underlie the floating nodes 116 and the pickup vias 120. The deep cell wells 210 respectively surround the collector regions 104c along a boundary of the pixels 102. The shallow and deep cell wells 208, 210 share a common doping type but different doping concentrations. For example, the shallow cell wells 208 may have a higher doping concentration than the deep cell wells 210. Further, the shallow and deep cell wells 208, 210 have the same doping type as, but different doping concentrations than, the bulk region 104b of the substrate 104 and/or the pickup vias 120. Further yet, the shallow and deep cell wells 208, 210 have an opposite doping types as the floating nodes 116 and the collector regions 104c.

First-level sidewall spacers 212 are individual to the transfer gate electrodes 112 and respectively on sidewalls of the transfer gate electrodes 112. The first-level sidewall spacers 212 may be or comprise, for example, silicon oxide, silicon nitride, some other suitable dielectric(s), or any combination of the foregoing.

Mesa hard mask structures 214 are individual to and respectively cover the mesas 118. Further, a device-mesa hard mask structure (shown but not individually labeled) of the multiple mesa hard mask structures 214 is at the device mesa 118d and localizes the gate dielectric layer 126 to sidewalls of the device mesa 118d. In some embodiments (as illustrated), the mesa hard mask structures 214 each comprise a lower hard mask and an upper hard mask. Note that the lower and upper hard masks are shown but not individually labeled. In alternative embodiments, the mesa hard mask structures 214 are a single layer and/or material. The mesa hard mask structures 214 may, for example, be or comprise silicon oxide, silicon nitride, some other suitable hard mask material(s), or any combination of the foregoing.

Pickup-mesa dielectric layers 216 are individual to and respectively line sidewalls of the pickup mesas 118p. The pickup-mesa dielectric layers 216 may be or comprise, for example, silicon oxide and/or some other suitable dielectric(s).

An interlayer dielectric (ILD) structure 140ild and a plurality of inter-metal dielectric (IMD) layers 140imd are stacked on the frontside of the substrate 104 and are separated from each other by a plurality of etch stop layers 218. The ILD structure 140ild, the IMD layers 140imd, and the etch stop layers 218 collectively define a frontside dielectric layer 140 (see FIG. 1) that surrounds structure on the frontside of the substrate 104. The ILD structure 140ild and the IMD layers 140imd may be or comprise, for example, silicon oxide, a low k dielectric, some other suitable dielectric(s), or any combination of the foregoing. The etch stop layers 218 may be or comprise, for example, silicon nitride, silicon carbide, some other suitable etch stop material(s), or any combination of the foregoing.

Buffer layers 220 respectively overlie the inter-level pads 128 and the source-follower gate electrode 124, between the ILD structure 140ild and the inter-level pads 128 and between the ILD structure 140ild and the source-follower gate electrode 124. The buffer layers 220 may be or comprise, for example, silicon oxide and/or some other suitable dielectric(s).

With reference to FIG. 3A, a top layout 300A of some embodiments of the SOI DoP image sensor of FIG. 2 is provided. The cross-sectional view 200 of FIG. 2 may, for example, be taken along line A-A'. The SOI DoP image sensor comprises at least four pixels 102, each as the pixels 102 of FIG. 2 are illustrated and described. The pixels 102 comprise individual transfer transistors 110 and individual floating nodes 116. The transfer transistors 110 comprise individual transfer gate electrodes 112 extending into corresponding photodetectors 108 (see FIG. 2) at corresponding trenches 302 (shown in phantom by dashed boxes) when viewed in profile. The floating nodes 116 and collector regions 104c (see FIG. 2) of the photodetectors 108 respectively define source/drain regions of the transfer transistors 110.

The inter-device contact vias 130 are on the transfer gate electrodes 112 and the floating nodes 116. Inter-device contact vias 130 on the transfer gate electrodes 112 extend from the transfer gate electrodes 112 to the interconnect structure 138 (see FIG. 2) when viewed in profile. Inter-device contact vias 130 on the floating nodes 116 extend from the floating nodes 116 to the source-follower gate electrode 124 (see FIG. 2 or 3B) when viewed in profile.

The plurality of mesas 118 include a plurality of pickup mesas 118p and a plurality of device mesas 118d. The pickup mesas 118p are individual to and respectively at the pixels 102. Further, the pickup mesas 118p are electrically coupled to a bulk region 104b of the substrate 104 (see FIG. 2) by a plurality of pickup vias 120 when viewed in cross section. The device mesas 118d support a source-follower transistor 122 (see FIG. 2 or 3B) and other readout transistors (not shown). Such other readout transistors may, for example, include a reset transistor 306 (see FIG. 3B), a row select transistor 304 (see FIG. 3B), some other suitable readout transistors, or any combination of the foregoing.

With reference to FIG. 3B, a top layout 300B of some more detailed embodiments of the SOI DoP image sensor of FIG. 3A is provided in which the SOI DoP image sensor further comprises readout transistors and the interconnect contact vias 134. The readout transistors comprise the source-follower transistor 122, a row select transistor 304, and a pair of reset transistors 306. The source-follower transistor 122 and the row select transistor 304 are on a common device mesa of the plurality of device mesas 118d, and the reset transistors 306 are on individual device mesas of the plurality of device mesas 118d.

The readout transistors comprise corresponding source/drain regions 308 between which corresponding gate electrodes are arranged. The source-follower transistor 122 comprises the source-follower gate electrode 124, the row select transistor 304 comprises a row-select gate electrode 310, and the reset transistors 306 comprise individual reset gate electrodes 312. The source/drain regions 308 are in the device mesas 118d and vary in doping type depending on transistor type. For example, the readout transistors may be metal-oxide-semiconductor field-effect transistors (MOSFETs) and hence the source/drain regions 308 may have an opposite doping type as corresponding transistor bodies. As another example, the readout transistors may be JFETs and hence the source/drain regions 308 may have the same doping type as, albeit with a higher doping concentration than, corresponding transistor bodies. The transistor bodies may, for example, correspond to bulk or well regions of the device mesas 118d. In some embodiments, one or more of the readout transistors are P-channel field-effect transistor (FETs), whereas a remainder of the readout transistors are N-channel FETs, or vice versa. In some embodiments, the readout transistors are full-depletion type transistors. In other words, depletion regions of the readout transistors extend through an entire thickness of the device mesas 118d.

Because the mesas 118 are independent of the substrate 104, the readout transistor are on a different device level than the transfer transistors 110 and the photodetectors 108 (see FIG. 2). As a result, the readout transistors are not constrained by the transfer transistors 110 and the photodetectors 108. For example, the readout transistors may be JFETs and/or a full-depletion transistor. As another example, the readout transistors may be P-channel MOSFETs and/or P-channel JFETs, whereas the transfer transistors may be N-channel MOSFETs. Because the readout transistors may be JFETs, noise (e.g., RTS noise and/or some other suitable noise) may be low and gain may be high. Because the readout transistors may be full-depletion transistors, leakage and junction capacitance may be low.

Figure 4:
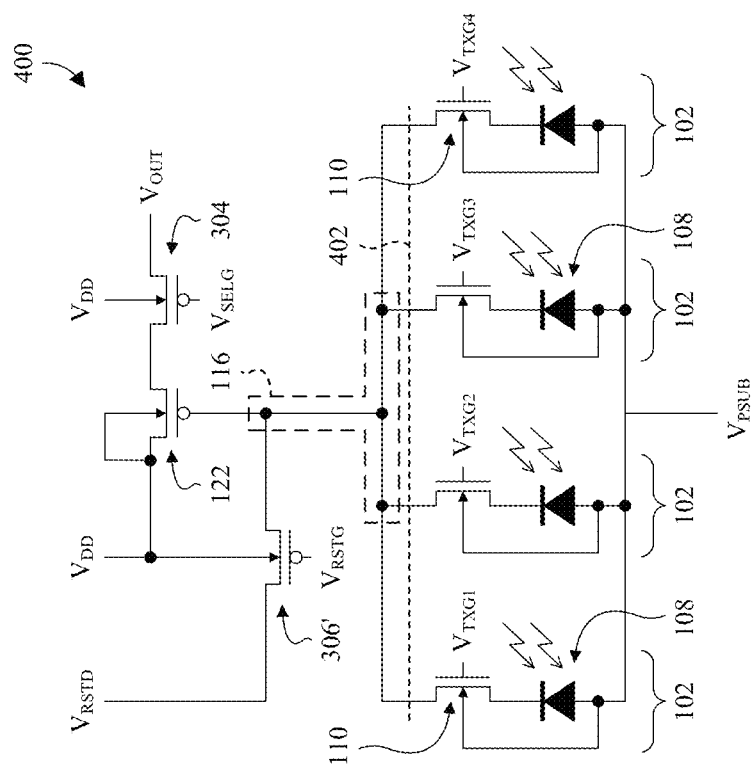
FIG. 4 illustrates a circuit diagram of some embodiments of Sol DoP image sensor of FIG. 2.

With reference to FIG. 4, a circuit diagram 400 of some embodiments of the SOI DoP image sensor of FIG. 2 is provided in which the transfer transistors 110 are N-channel FETs and the readout transistors are P-channel FETs. The transfer transistors 110 and the photodetectors 108 are on/in a substrate 104 (see FIG. 2), whereas the readout transistors are spaced over the substrate 104. This is schematically illustrated by the dashed line 402. The substrate 104 is P-type and is biased with a substrate voltage $V_{PSUB}$, whereas the transfer transistors 110 are biased with a transfer-gate voltage $V_{TXG<1 \ldots 4>}$. The substrate voltage $V_{PSUB}$ may, for example, be applied to the bulk region 104b (see FIG. 2) of the substrate 104 through the pickup vias 120 (see FIGS. 2 and 3B).

The readout transistors comprise the source-follower transistor 122, the row select transistor 304, and the reset transistors 306 in FIGS. 2 and 3B. However, the reset transistors 306 of FIG. 3B are electrically coupled in parallel within FIG. 4 and are hence illustrated as a single reset transistor 306'. The row select transistor 304 is biased with a select-gate voltage $V_{SELG}$, the reset transistor 306' is biased with a reset-gate voltage $V_{RSTG}$, and a drain region of the reset transistor 306' is biased with a reset-drain voltage $V_{RSTG}$.

During use of the image sensor, the reset transistor 306' clears charge accumulated in the photodetectors 108 and at the floating node 116 by electrically coupling the photodetectors and the floating node 116 to the reset-drain voltage $V_{RSTD}$. One of the transfer transistors 110 then transfers electrons accumulated in a corresponding one of the photodetectors 108 to the floating node 116. Further, the source-follower transistor 122 amplifies the transferred electrons at the floating node 116, and the row select transistor 304 selects the pixels 102 to allow readout.

Because the readout transistors are spaced from the transfer transistors 110 and the photodetectors 108, switching noise and other noise from the readout transistors is not injected into the photodetectors 108 and/or the transfer transistors 110. Because the readout transistors are P-channel FETs, instead of N-channel FETs, switching noise and other noise from the readout devices may be low and a voltage swing at the floating node may be high during electron transfer. As to the former, P-channel FETs typically have less noise than N-channel FETs. As to the latter, the reset-gate voltage $V_{RSTG}$ generates a "clock feedthrough effect" (e.g., by capacitive coupling) that varies the voltage at the floating node 116 and facilitates electron transfer.

When the reset transistor 306' is in a conducting state (i.e., ON), the voltage at the floating node 116 is about the same as the reset-drain voltage $V_{RSTD}$. However, when the reset transistor 306' is in a non-conducting state (i.e., OFF), the voltage at the floating node 116 floats up or down depending upon the reset-gate voltage $V_{RSTG}$. When the reset-gate voltage $V_{RSTG}$ is higher than a voltage at the floating node 116, the voltage at the floating node 116 moves higher. When the reset-gate voltage $V_{RSTG}$ is lower than a voltage at the floating node 116, the voltage at the floating node 116 moves lower. If the reset transistor 306' were an N-channel FET, the reset-gate voltage $V_{RSTG}$ would be at a low voltage (e.g., approximate 0 volts or some other suitable voltage) during charge transfer. Hence, the voltage at the floating node 116 would float down and the voltage difference between the substrate voltage $V_{PSUB}$ and the voltage at the floating node 116 would be small. This small voltage difference would, in turn, lead to a small electric field across the photodetector and hence a slow and potentially incomplete charge transfer. On the other hand, because the reset transistor 306' is a P-channel FET, the reset-gate voltage $V_{RSTG}$ is at a high voltage (e.g., approximate 2.5 volts or some other suitable voltage) during electron transfer. Hence, the voltage at the floating node 116 floats up, or otherwise maintains a high voltage, and the voltage difference between the substrate voltage $V_{PSUB}$ and the voltage at the floating node 116 is high. This high voltage difference, in turn, leads to a large electric field across the photodetector and hence a fast, complete electron transfer.

Due to the enhanced charge transfer, voltage at the floating node 116 undergoes a large swing during electron transfer and hence an output voltage $V_{OUT}$ at the row select transistor 304 undergoes a large swing during electron transfer. Further, the large swing isn't dependent upon boosting, which increases costs, complexity, and power consumption. Boosting may, for example, be used when the readout transistors are N-channel FETs. For example, the reset-gate voltage $V_{RSTG}$ may be boosted so channel resistance is low and a voltage drop across the reset transistor 306' is small. This leads to a higher initial voltage at the floating node 116 and hence a larger swing. As another example, the select-gate voltage $V_{SELG}$ may be boosted so channel resistance is low and a voltage drop across the row select transistor 304 is small. This leads to a higher output voltage $V_{OUT}$ at the row select transistor 304 and hence a larger swing.

Figure 5:
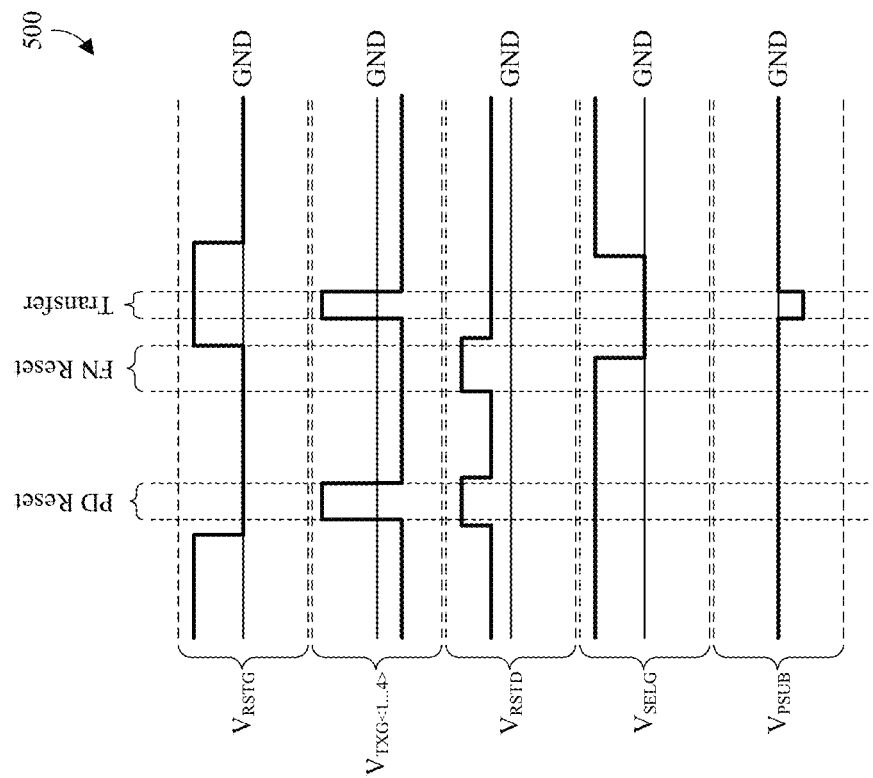
FIG. 5 illustrates a timing diagram of some embodiments of the SOI DoP image sensor of FIG. 4.

With reference to FIG. 5, a timing diagram 500 for some embodiments of the SOI DoP image sensor of FIG. 4 during readout of any one of the photodetectors 108 is provided. Initially, the photodetector and the floating node 116 are reset by setting the reset transistor 306' and a corresponding one of the transfer transistors 110 to conducting (i.e., ON) states. Further, the floating node 116 is reset by setting the reset transistor 306' to a conducting state while the transfer transistors 110 are in non-conducting (i.e., OFF) states. Thereafter, charge accumulated in the photodetector is transferred to the floating node 116 by setting a transfer transistor corresponding to the photodetector to a conducting state while the reset transistor 306' is in non-conducting state. The transferred charge gates the source-follower transistor 122, which amplifies the transferred charge for readout. Further, the row select transistor 304 is set to a conducting state to allow readout.

In some embodiments, during the transfer of charge from the photodetector to the floating node 116, the substrate voltage $V_{PSUB}$ is at ground (i.e., 0 volts). In other embodiments (as illustrated), the substrate voltage $V_{PSUB}$ is negative during the transfer. The negative bias leads to a high voltage difference between the substrate voltage $V_{PSUB}$ and the voltage at the floating node 116. This high voltage difference, in turn, leads to a large electric field across the photodetector and hence a fast, complete electron transfer. Due to the enhanced charge transfer, voltage at the floating node 116 undergoes a large swing.

While FIGS. 4 and 5 are described with regard to embodiments of the SOI DoP image sensor of FIG. 2, it is to be appreciated that the discussion is equally applicable to other embodiments of the SOI DoP image sensor. For example, the discussion regarding FIGS. 4 and 5 is applicable to embodiments of the SOI DoP image sensor in FIG. 1 or any one or combination of the multiple alternative embodiments of the SOI DoP image sensor discussed hereafter.

Figure 6:
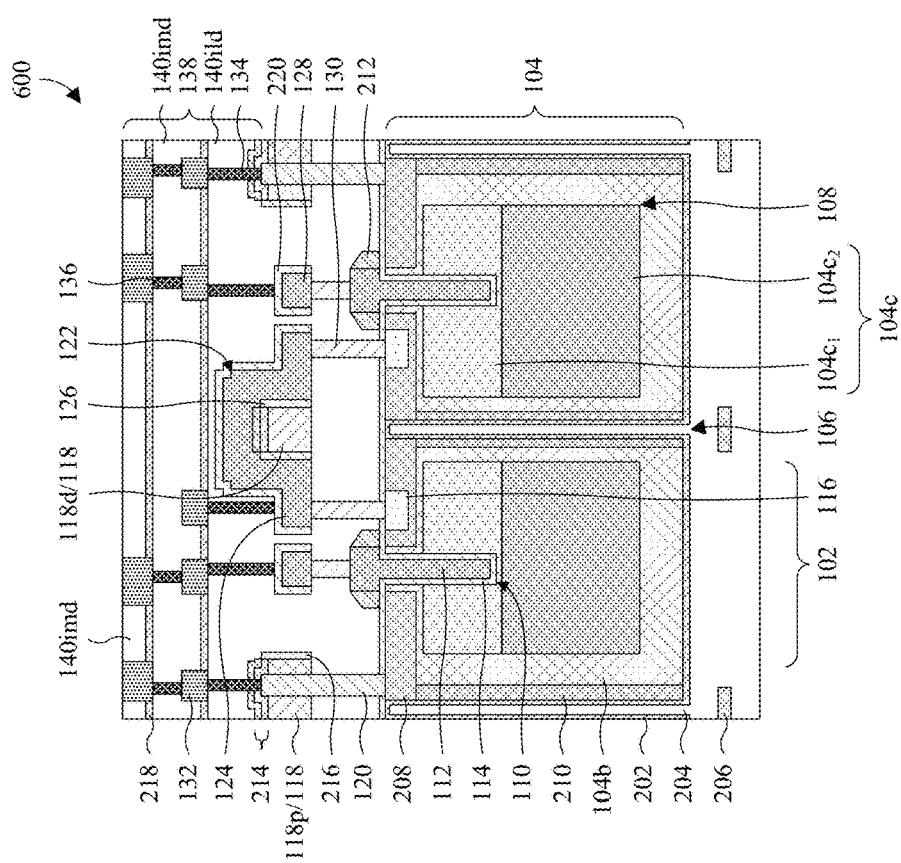
FIG. 6 illustrates a cross-sectional view of some alternative embodiments of the SOI DoP image sensor of FIG. 2 in which an interconnect structure has a different configuration.

With reference to FIG. 6, a cross-sectional view 600 of some alternative embodiments of the SOI DoP image sensor of FIG. 2 is provided in which the interconnect structure 138 has a different configuration. For example, an interconnect contact via 134 at the source-follower gate electrode 124 is shifted to a side of the source-follower gate electrode 124. Additionally, the source-follower gate electrode 124 has a cross-sectional profile that is symmetrical or substantially symmetrical about a vertically axis equally bisecting a width of the source-follower gate electrode 124.

Figure 7:
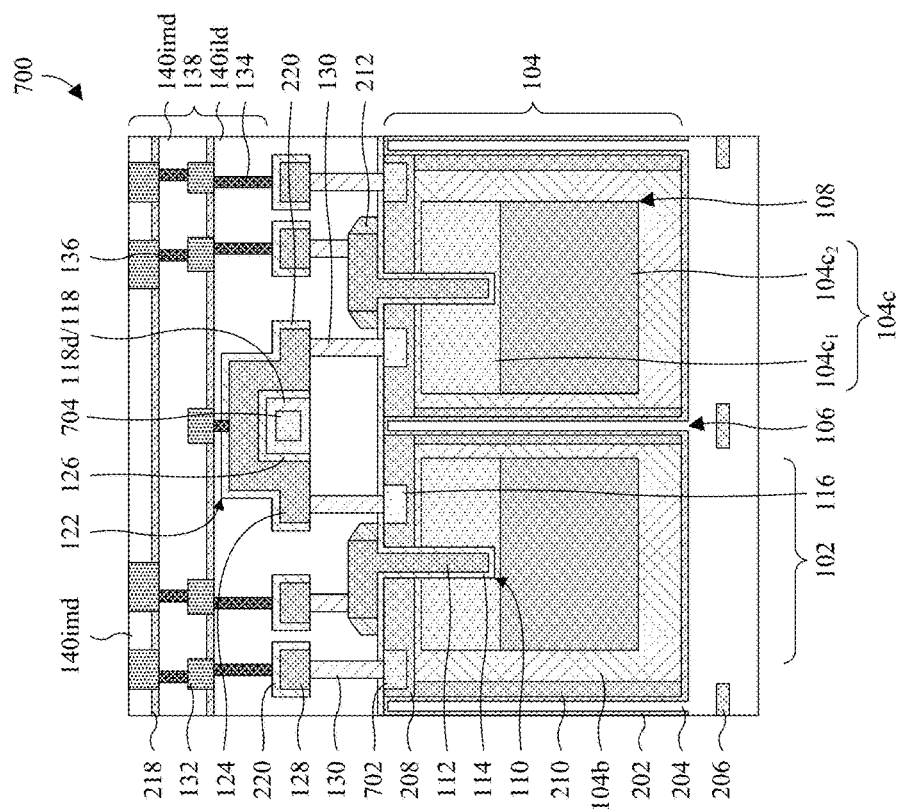
FIG. 7 illustrates a cross-sectional view of some alternative embodiments of the SOI DoP image sensor of FIG. 2 in which pickup mesas are omitted.

With reference to FIG. 7, a cross-sectional view 700 of some alternative embodiments of the SOI DoP image sensor of FIG. 2 is provided in which the pickup mesas 118p are omitted. Instead, inter-level pads 128 replace the pickup mesas 118p. Further, the mesa hard mask structures 214 and the pickup-mesa dielectric layers 216 are omitted.

The inter-device contact vias 130 extend from the inter-level pads 128 and the source-follower gate electrode 124 to the substrate 104, and the interconnect structure 138 electrically couples to the inter-level pads 128 and the source-follower gate electrode 124. Inter-device contacts at the source-follower gate electrode 124 extend from the source-follower gate electrode 124 to the floating nodes 116, whereas inter-device contacts at the inter-level pads 128 extend from the inter-level pads 128 respectively to the substrate 104 and the transfer gate electrodes 112. Inter-device contacts contact the substrate 104 respectively at pickup regions 702 of the substrate 104. The pickup regions 702 respectively overlie the shallow cell wells 208 and have the same doping type as, but a higher doping concentration than, the shallow cell wells 208.

A buried channel region 704 is buried in the device mesa 118d, such that the source-follower transistor 122 is a buried channel FET. Compared to a surface channel FET, a buried channel FET may have less noise. The buried channel region 704 extends laterally (into and out of the page) from a source/drain region (not shown) of the source-follower transistor 122 to another source/drain region (not shown) of the source-follower transistor 122. The buried channel region 704 may, for example, have the same doping type as the source/drain regions of the source-follower transistor 122 and/or may, for example, have an opposite doping type as a bulk region of the device mesa 118d.

Figure 8B:
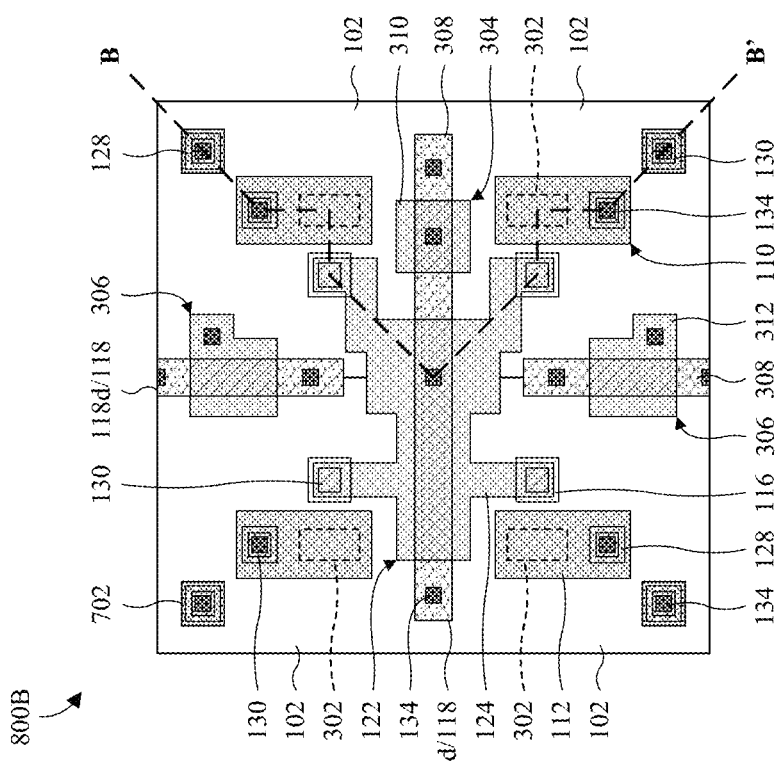
FIGS. 8A and 8B illustrates top layouts of some embodiments of the SOI DoP image sensor of FIG. 7.
Figure 8A:
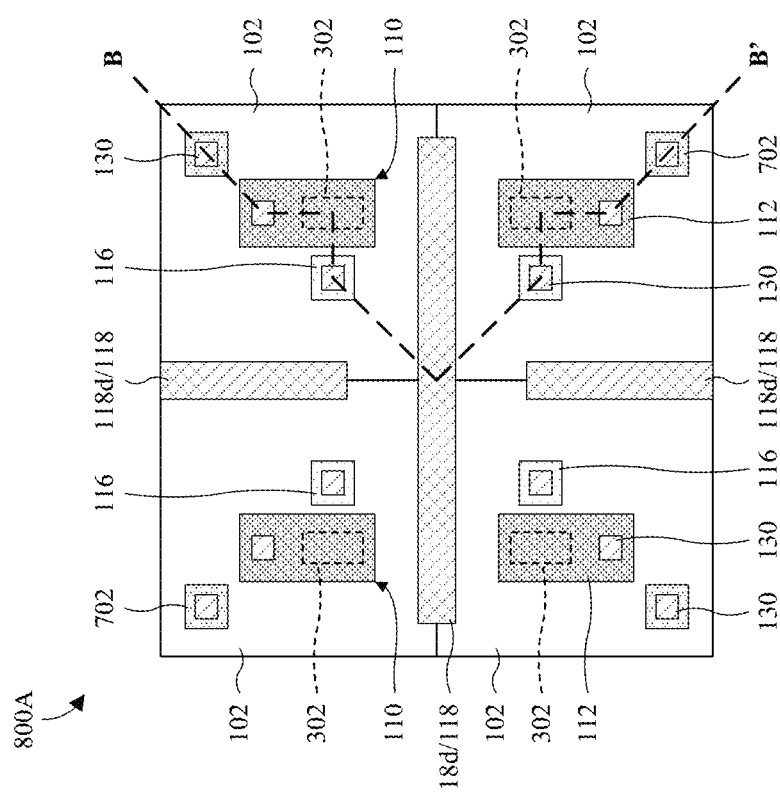

With reference to FIGS. 8A and 8B, top layouts 800A, 800B of some embodiments of the SOI DoP image sensor of FIG. 7 is provided. The cross-sectional view 700 of FIG. 7 may, for example, be taken along line B-B'. The top layouts 800A, 800B are respectively as the top layouts 300A, 300B of FIGS. 3A and 3B are illustrated and described, except that the inter-level pads 128 replace the pickup mesas 118p.

With reference to FIG. 9, a cross-sectional view 900 of some alternative embodiments of the SOI DoP image sensor of FIG. 7 is provided in which the pickup regions 702 are between the source-follower transistor 122 and respective ones of the transfer transistors 110. Further, the interconnect structure 138 has a different configuration.

With reference to FIG. 10, a cross-sectional view 1000 of some alternative embodiments of the SOI DoP image sensor of FIG. 7 is provided in which the inter-level pads 128 and the inter-device contact vias 130 are omitted. Instead, the interconnect structure 138 electrically couples the source-follower transistor 122 to the transfer transistors 110 and directly electrically couples with the pickup regions 702 through the interconnect contact vias 134.

Moreover, the buried channel region 704 and the buffer layers 220 are omitted, and the gate dielectric layer 126 is localized to a top surface of the device mesa 118d. Further, one of the etch stop layers 218 lines a top of the source-follower transistor 122 to separate the ILD structure 140ild into an upper segment and a lower segment. Further yet, second-level sidewall spacers 1002 are on sidewalls of the source-follower gate electrode 124. The second-level sidewall spacers 1002 may, for example, be or comprise silicon nitride and/or some other suitable dielectric(s). Further, the second-level sidewall spacers 1002 may, for example, be the same material as the first-level sidewall spacers 212.

Figures 11A, 11B:
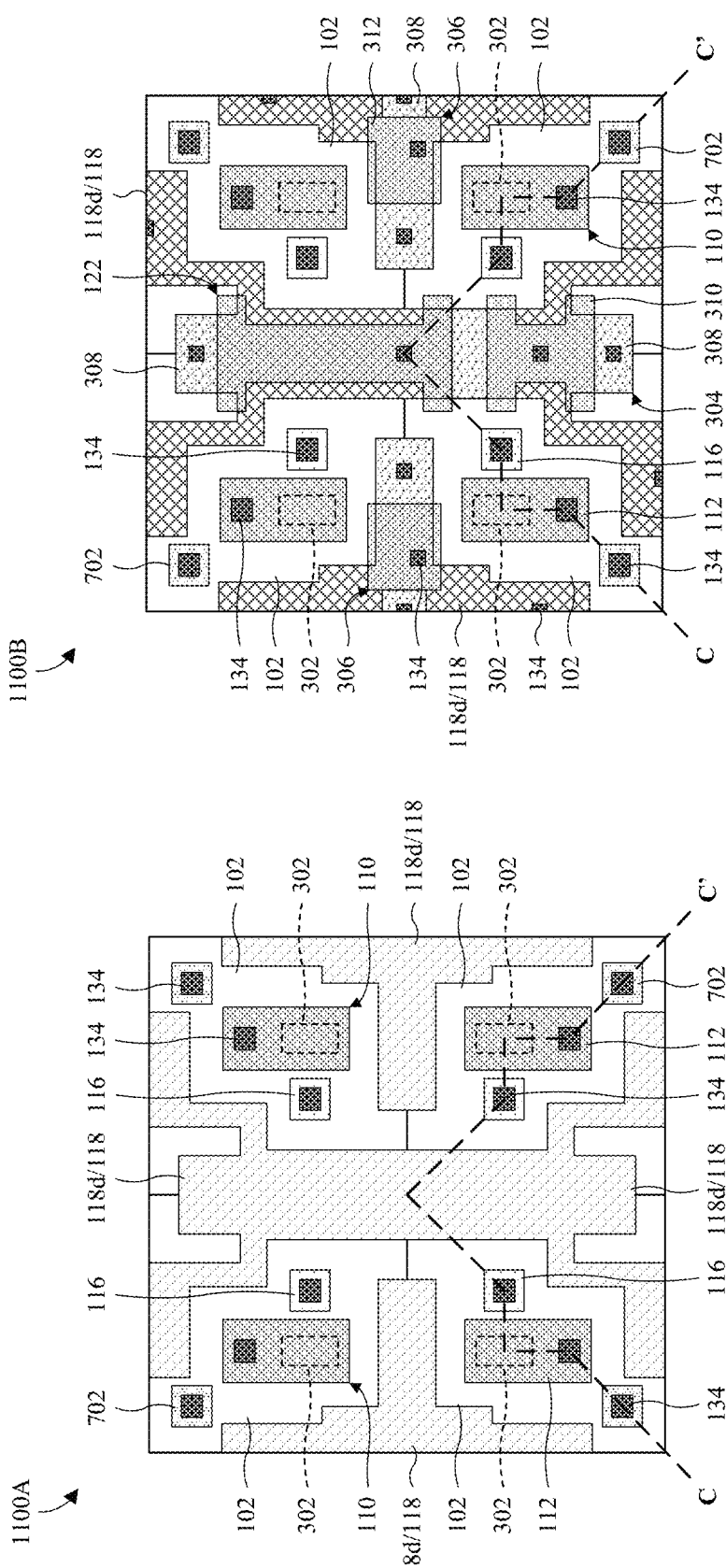
FIGS. 11A and 11B illustrates top layouts of some embodiments of the SOI DoP image sensor of FIG. 10.

With reference to FIGS. 11A and 11B, top layouts 1100A, 1100B of some embodiments of the SOI DoP image sensor of FIG. 10 is provided. The cross-sectional view 1000 of FIG. 10 may, for example, be taken along line C-C'. The top layouts 1100A, 1100B are respectively as the top layouts 300A, 300B of FIGS. 3A and 3B are illustrated and described, except that the pickup mesas 118p are omitted and the device mesas 118d have a different layout. Further, the interconnect contact vias 134 electrically couple with the substrate 104 at the pickup regions 702.

Figures 12, 13A:
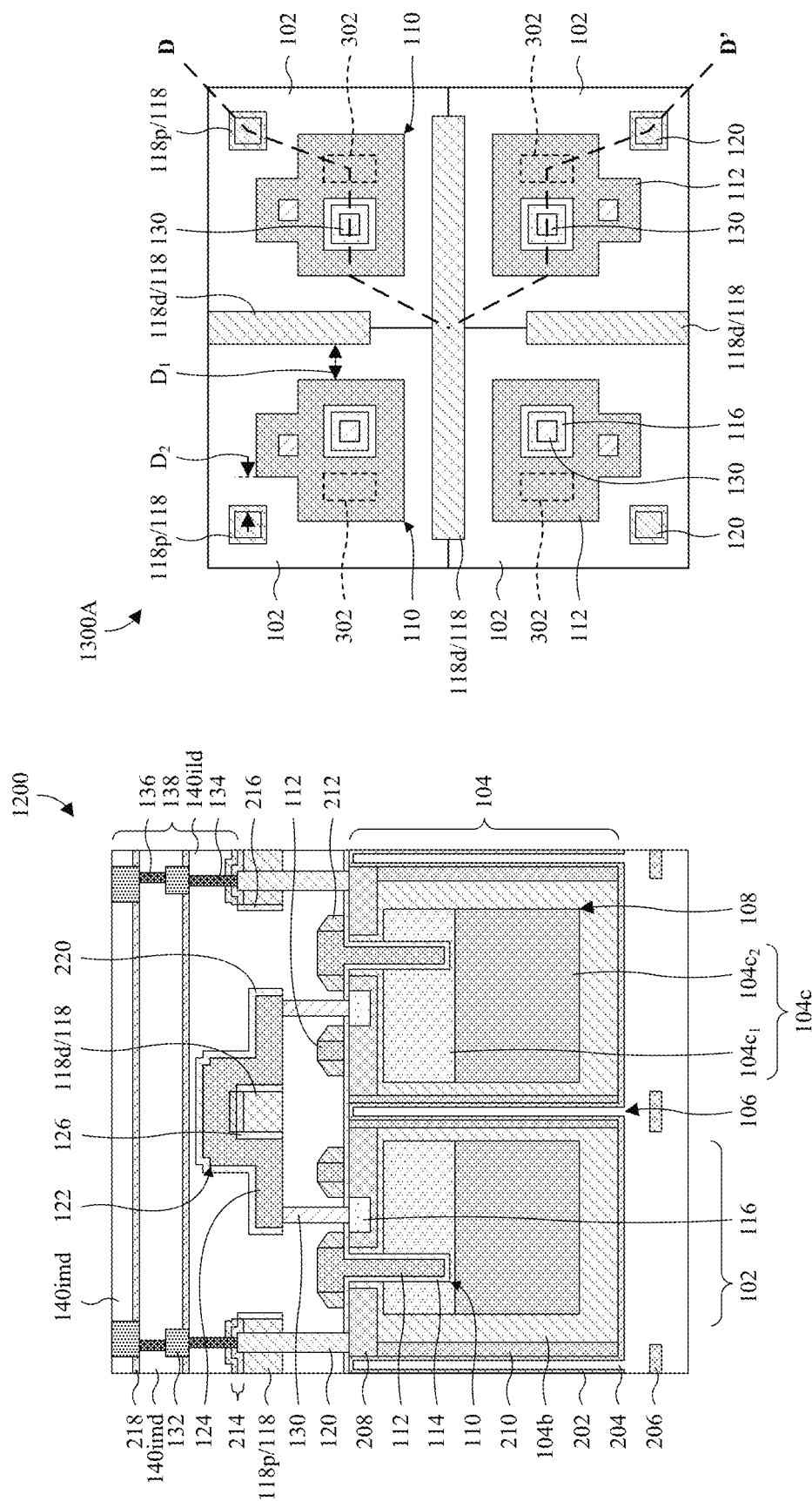
FIG. 12 illustrates a cross-sectional view of some alternative embodiments of the SOI DoP image sensor of FIG. 2 in which transfer gate electrodes surrounds surround corresponding floating nodes.
FIGS. 13A and 13B illustrate top layouts of some embodiments of the SOI DoP image sensor of FIG. 12.

With reference to FIG. 12, a cross-sectional view 1200 of some alternative embodiments of the SOI DoP image sensor of FIG. 2 is provided in which the transfer gate electrodes 112 surround corresponding ones of the floating nodes 116.

Figure 13B:
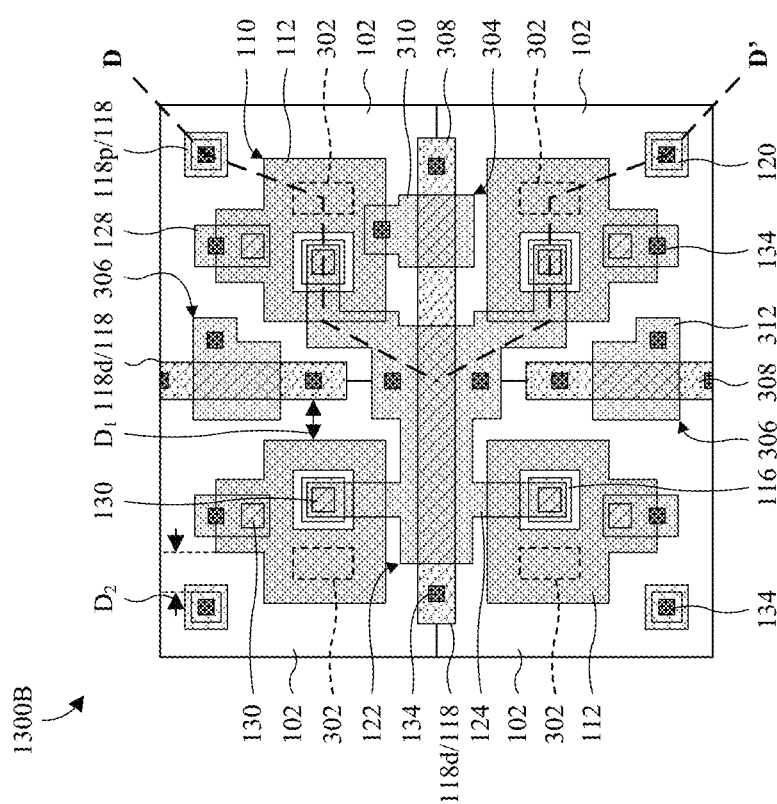

With reference to FIGS. 13A and 13B, top layouts 1300A, 1300B of some embodiments of the SOI DoP image sensor of FIG. 12 is provided. The cross-sectional view 1200 of FIG. 12 may, for example, be taken along line D-D'. The top layouts 1300A, 1300B are respectively as the top layouts 300A, 300B of FIGS. 3A and 3B are illustrated and described, except that the transfer gate electrodes 112 have layouts surrounding the floating nodes 116. The inter-device contact vias 130 extend through openings in the transfer gate electrodes 112, from the source-follower gate electrode 124 to the floating nodes 116. In some embodiments, a first distance $D_1$ from the transfer gate electrodes 112 respectively to the device mesas 118d is about 0-0.15 micrometers, about 0-0.7 micrometers, about 0.7-0.15 micrometers, or some other suitable value. In some embodiments, a second distance $D_2$ from the pickup vias 120 respectively to the transfer gate electrodes 112 is about 0.08-0.15 micrometers, about 0.08-0.11 micrometers, about 0.11-0.15 micrometers, or some other suitable value.

Figure 14:
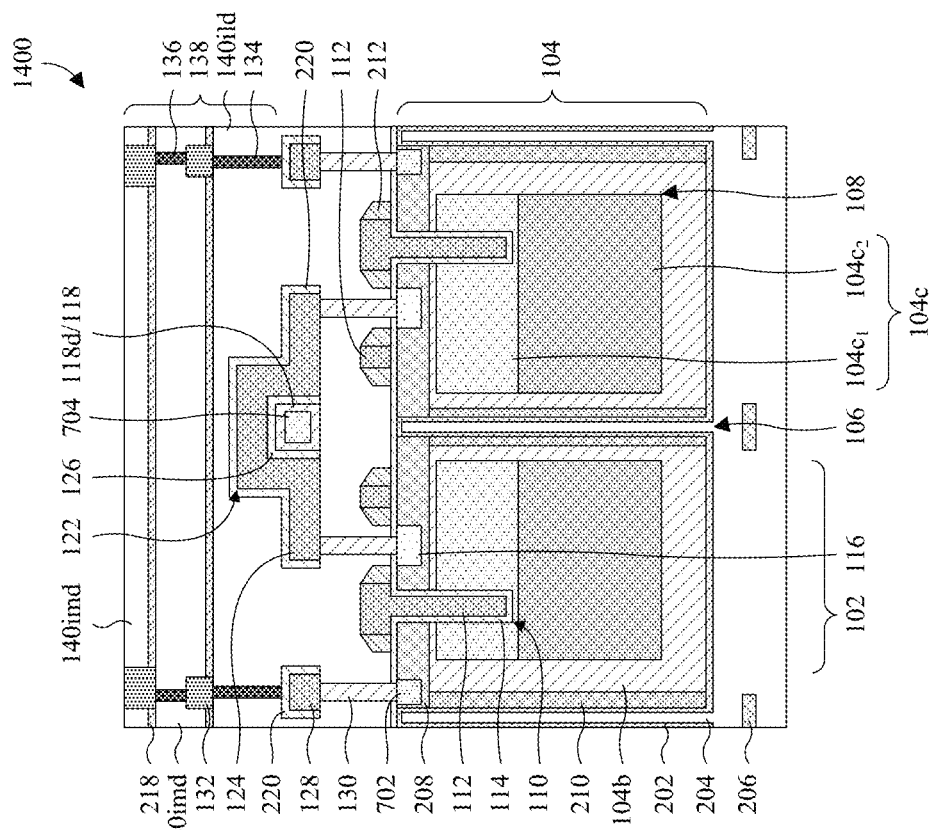
FIG. 14 illustrates a cross-sectional view of some alternative embodiments of the SOI DoP image sensor of FIG. 12 in which pickup mesas are omitted.

With reference to FIG. 14, a cross-sectional view 1400 of some alternative embodiments of the SOI DoP image sensor of FIG. 12 is provided in which the pickup mesas 118p are omitted. Instead, inter-level pads 128 replace the pickup mesas 118p. Further, the mesa hard mask structures 214 and the pickup-mesa dielectric layers 216 are omitted, and the pickup regions 702 and the buried channel region 704 at FIG. 7 are included.

Figure 15A:
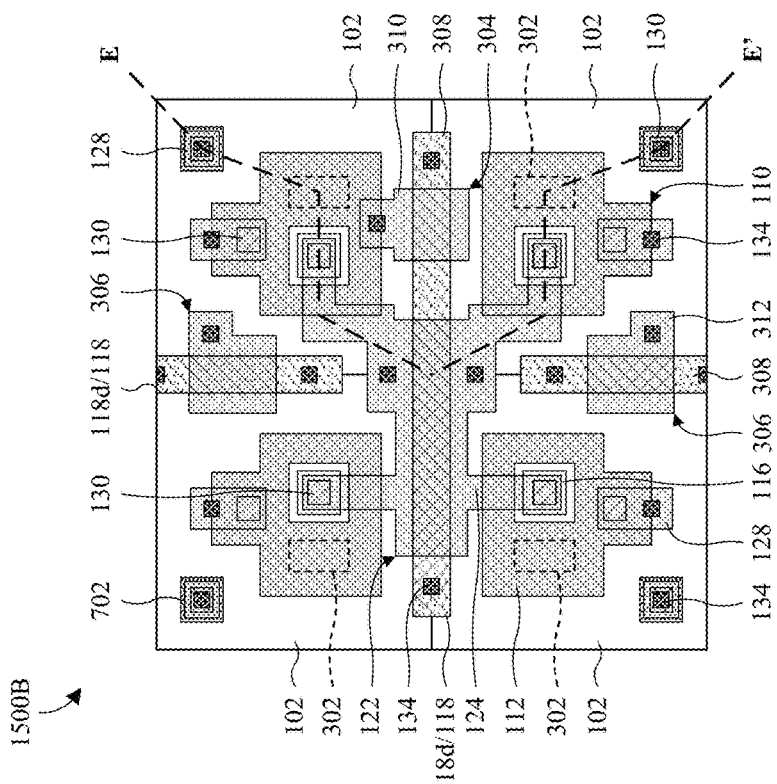
FIGS. 15A and 15B illustrate top layouts of some embodiments of the SOI DoP image sensor of FIG. 14.
Figure 15B:
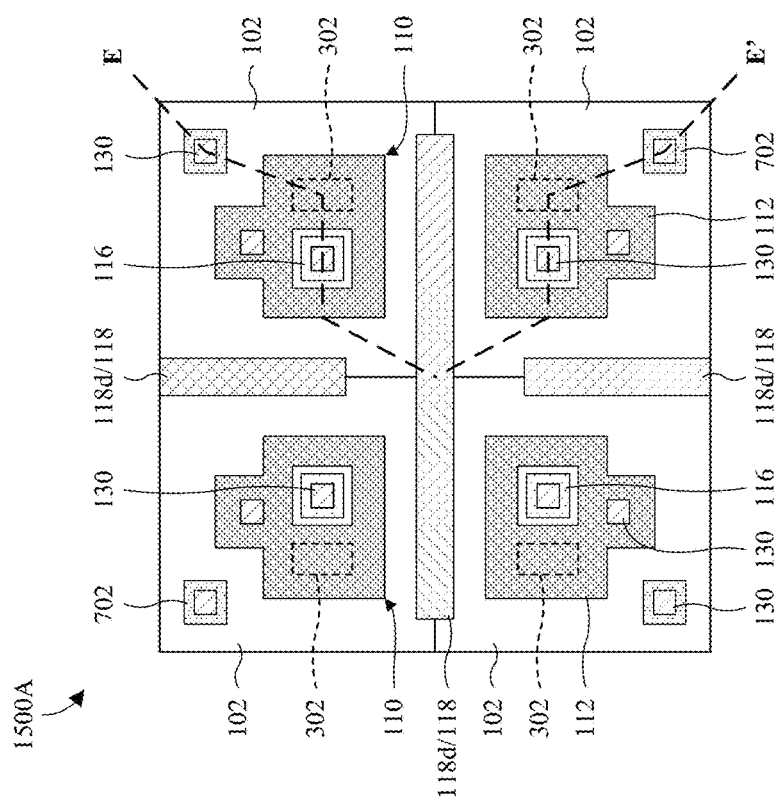

With reference to FIGS. 15A and 15B, top layouts 1500A, 1500B of some embodiments of the SOI DoP image sensor of FIG. 14 is provided. The cross-sectional view 1400 of FIG. 14 may, for example, be taken along line E-E'. The top layouts 1500A, 1500B are respectively as the top layouts 1300A, 1300B of FIGS. 13A and 13B are illustrated and described, except that the inter-level pads 128 replace the pickup mesas 118p.

While the SOI DoP image sensors of FIGS. 7, 8A, 8B, 9, 10, 11A, 11B, 14, 15A, and 15B are illustrated as including the pickup regions 702, the pickup regions 702 may be omitted in any one or combination of the SOI DoP image sensors. While the SOI DoP image sensors of FIGS. 7, 9, and 14 are illustrated as including the buried channel region 704, the buried channel region 704 may be omitted in any one or combination of the SOI DoP image sensors. While the SOI DoP image sensors of FIGS. 2, 6, 7, 9, 12, and 14 are illustrated as including the buffer layers 220, the buffer layers 220 may be omitted in any one or combination of the SOI DoP image sensors. While the SOI DoP image sensors of FIGS. 1, 2, 3A, 3B, 6, 12, 13A, and 13B are illustrated without the pickup regions 702 and the buried channel region 704, any one or combination of the SOI DoP image sensors may include the pickup regions 702 and/or the buried channel region 704.

Figure 16B:
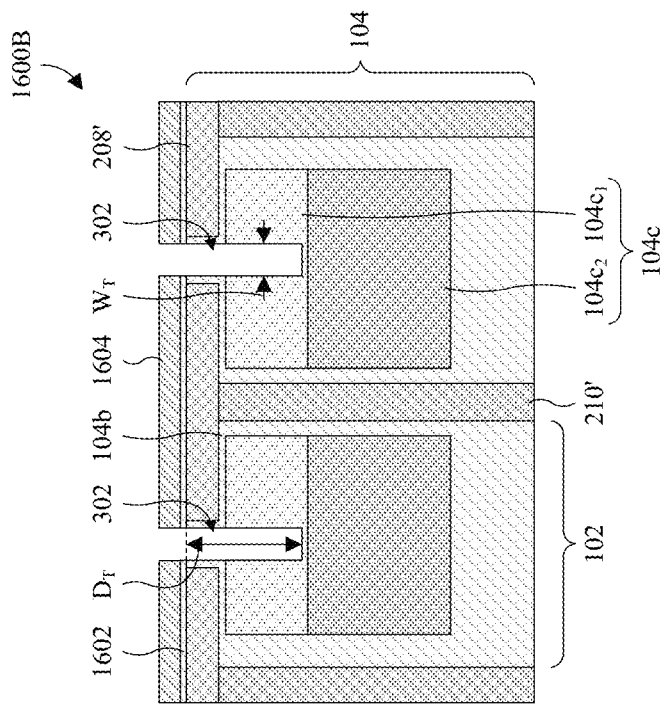
FIGS. 16A-16R illustrate a series of cross-sectional views of some embodiments of a method for forming a SOI DoP image sensor.
Figure 16A:
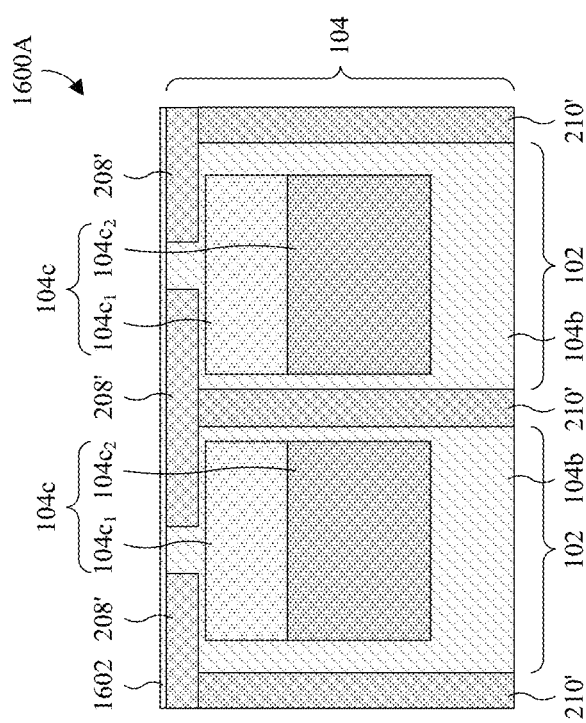
Figure 16D:
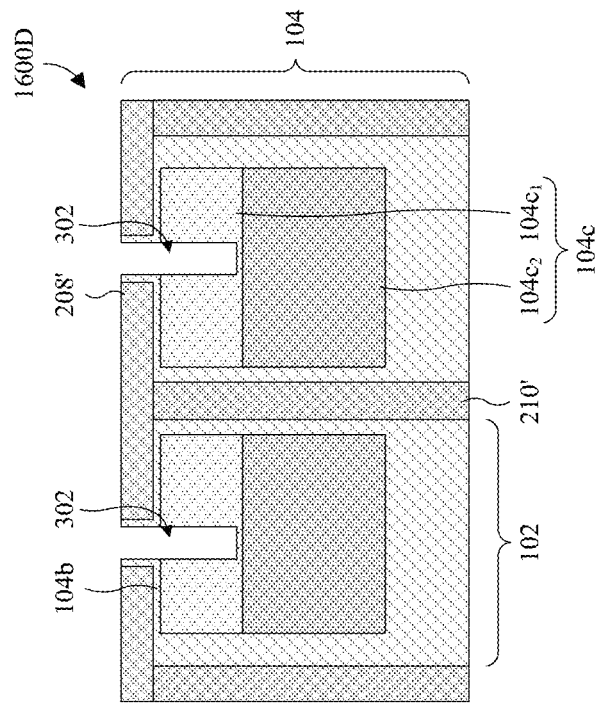
Figure 16C:
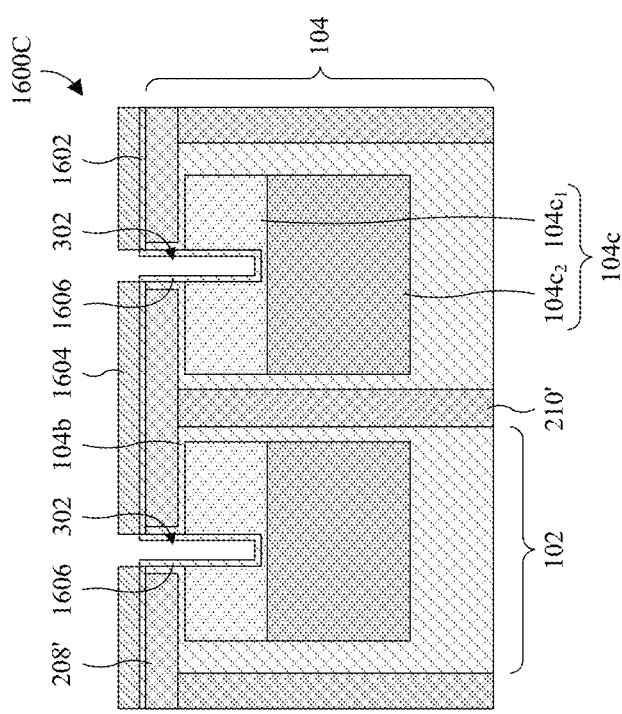
Figure 16F:
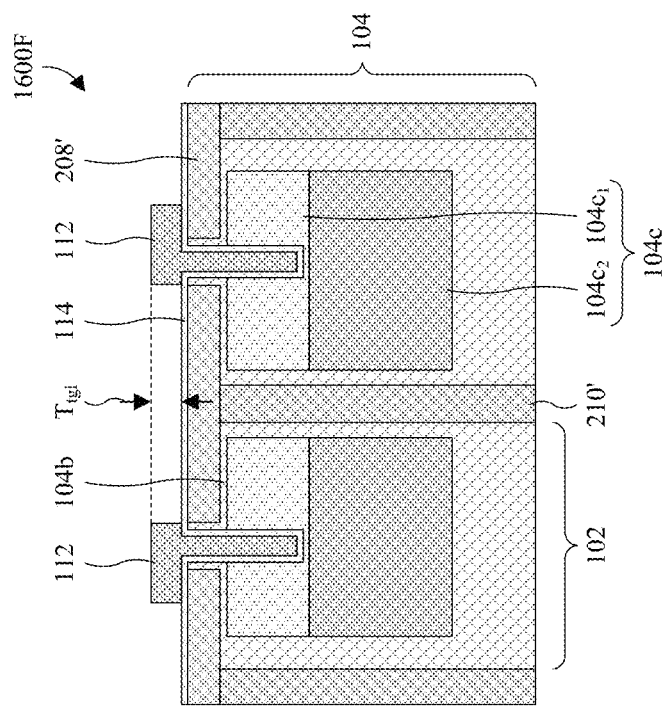
Figure 16E:
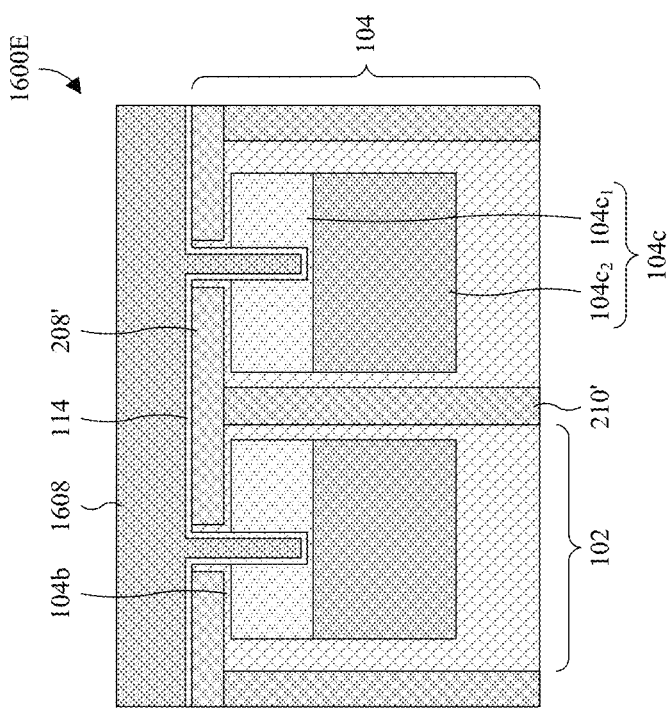
Figure 16H:
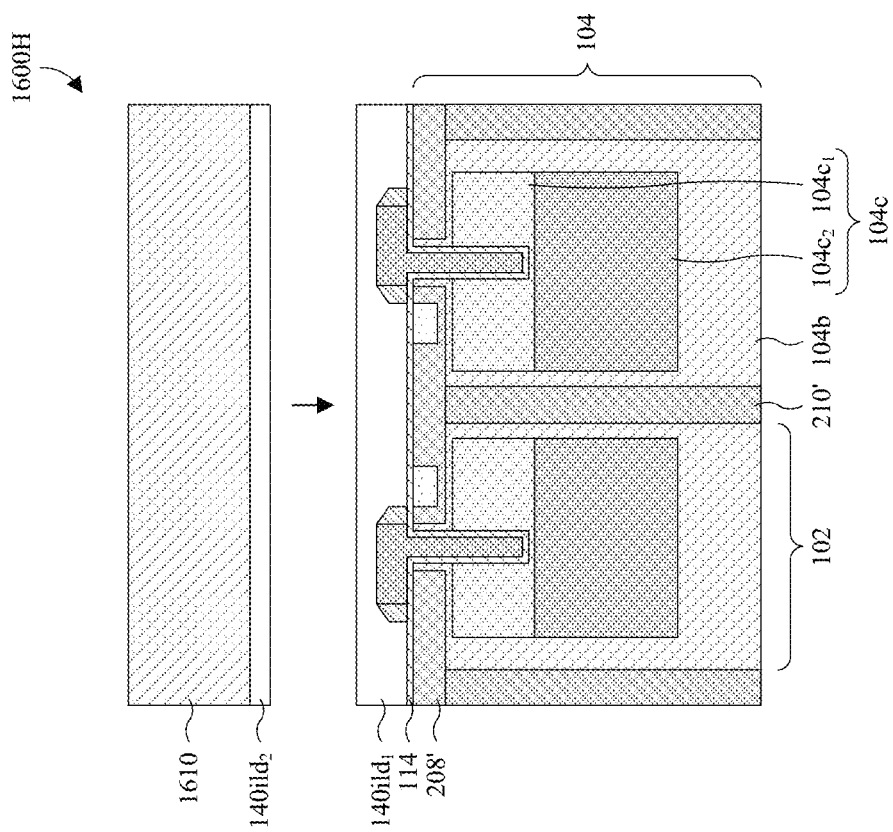
Figure 16G:
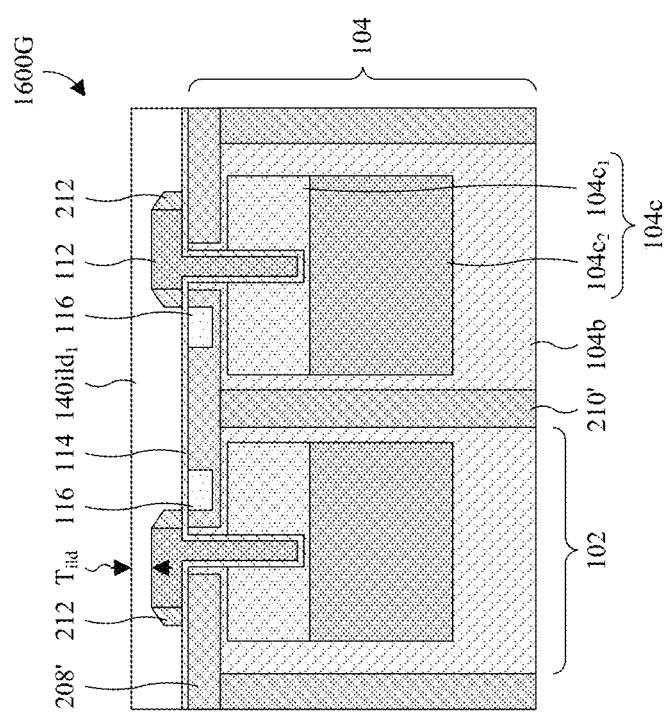
Figure 16J:
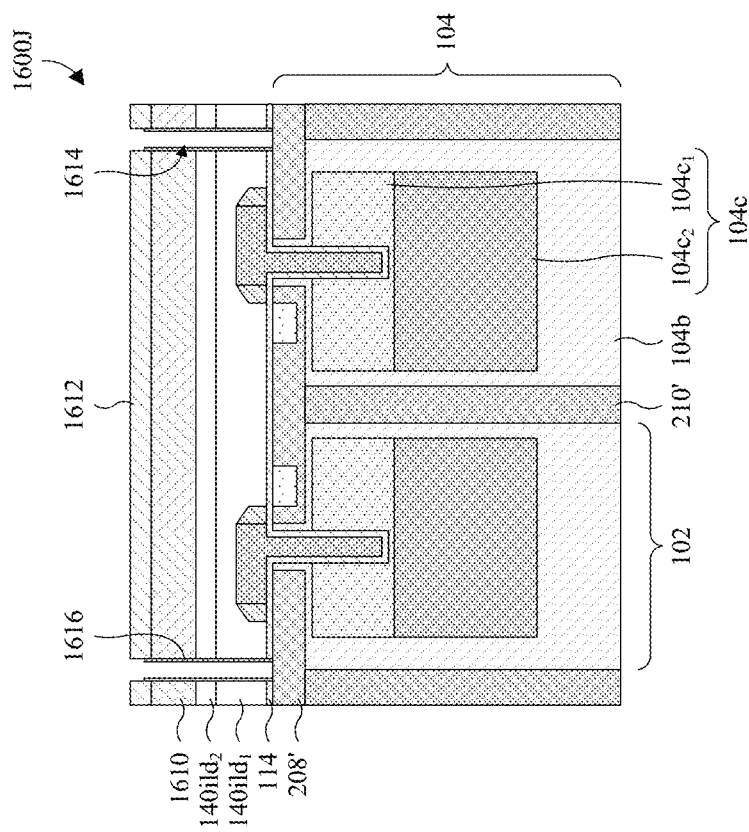
Figure 16I:
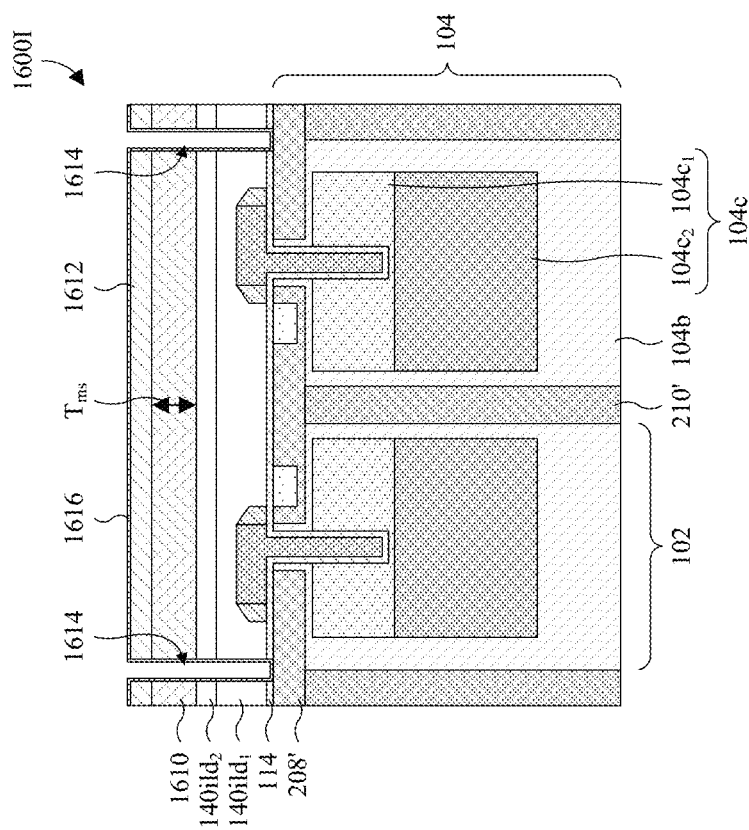
Figure 16L:
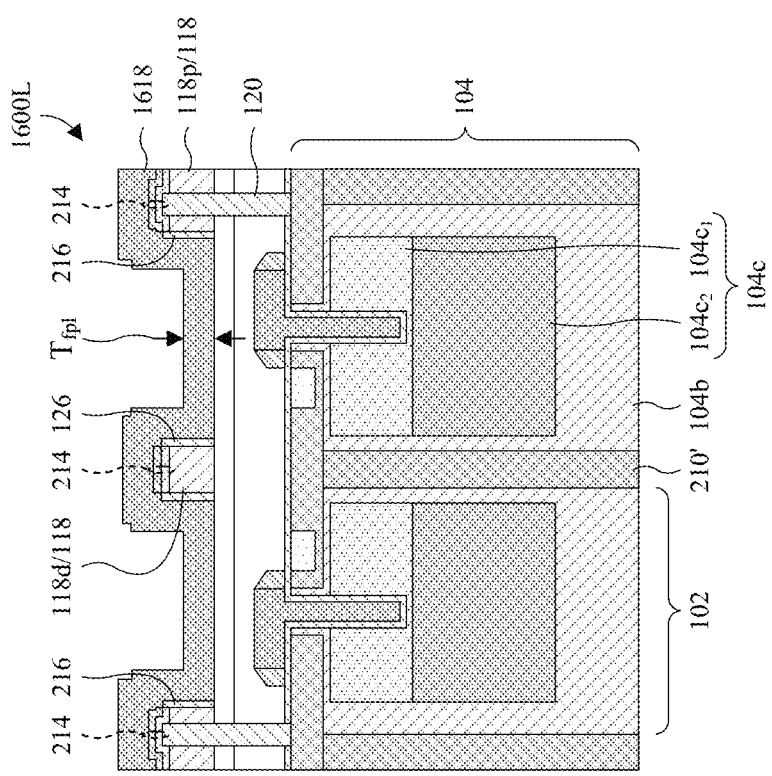
Figure 16K:
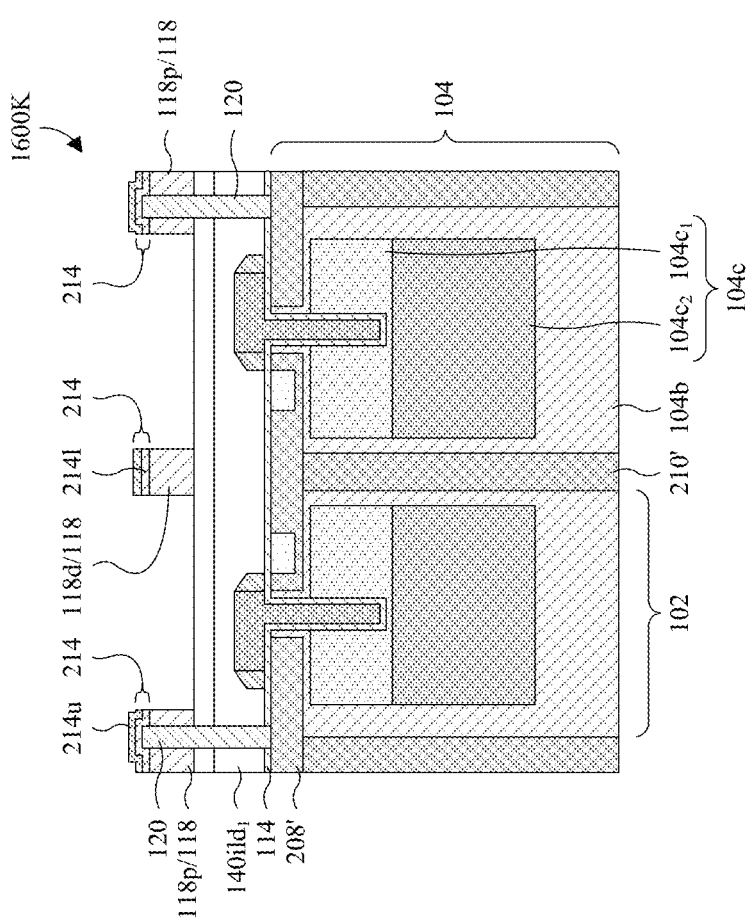
Figure 16N:
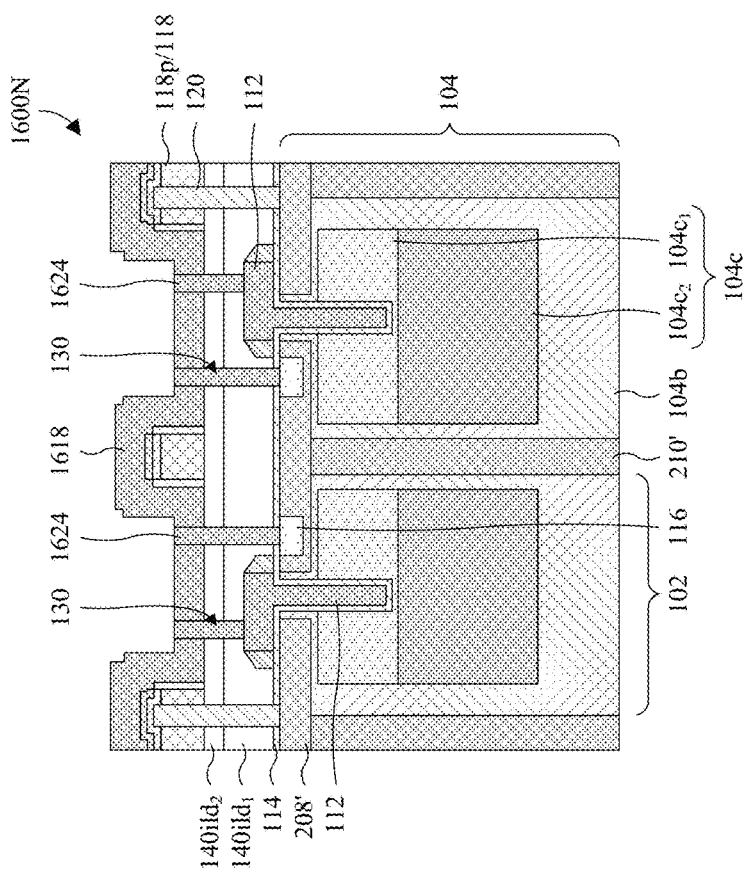
Figure 16M:
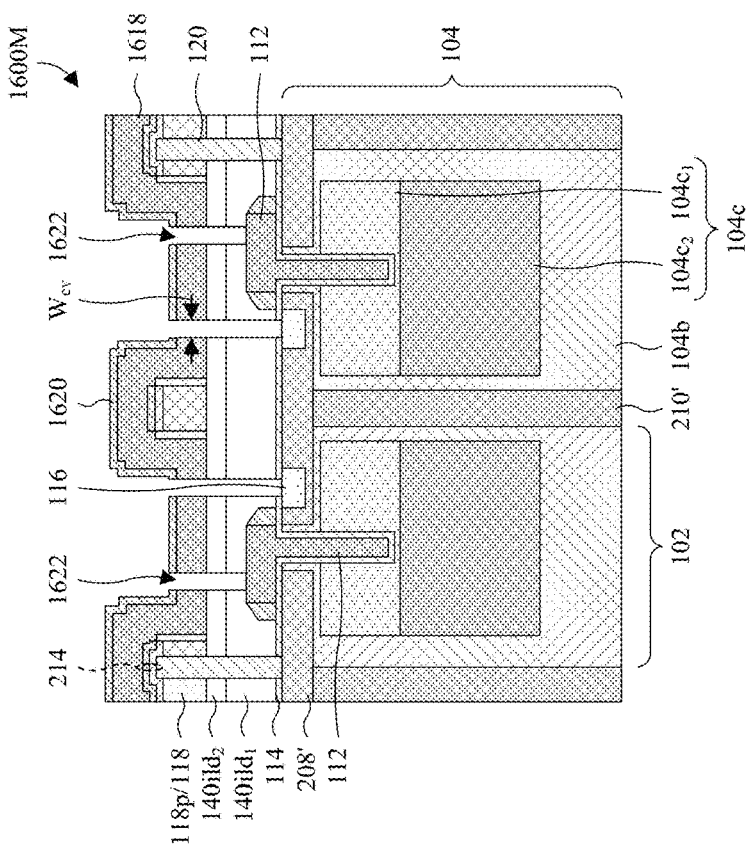
Figure 16P:
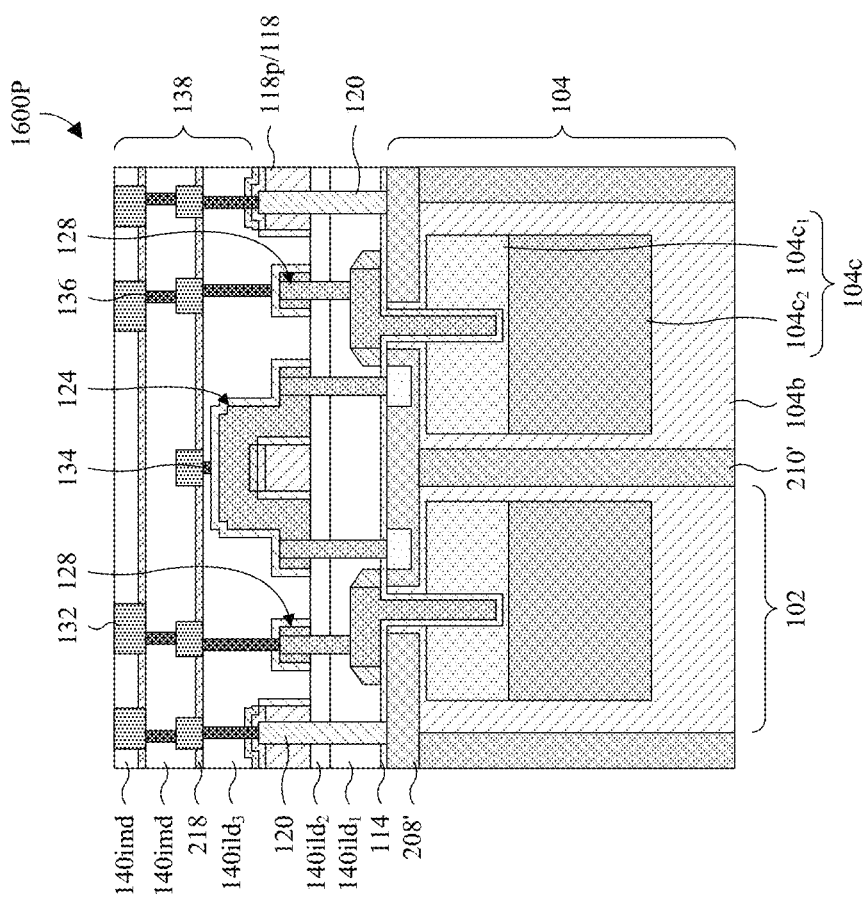
Figure 16O:
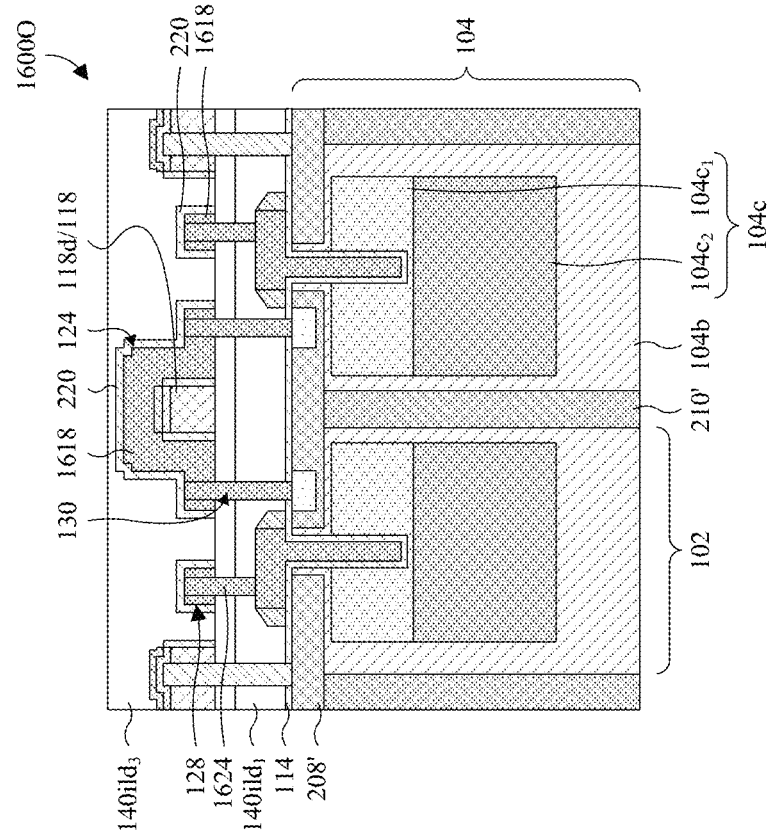
Figure 16R:
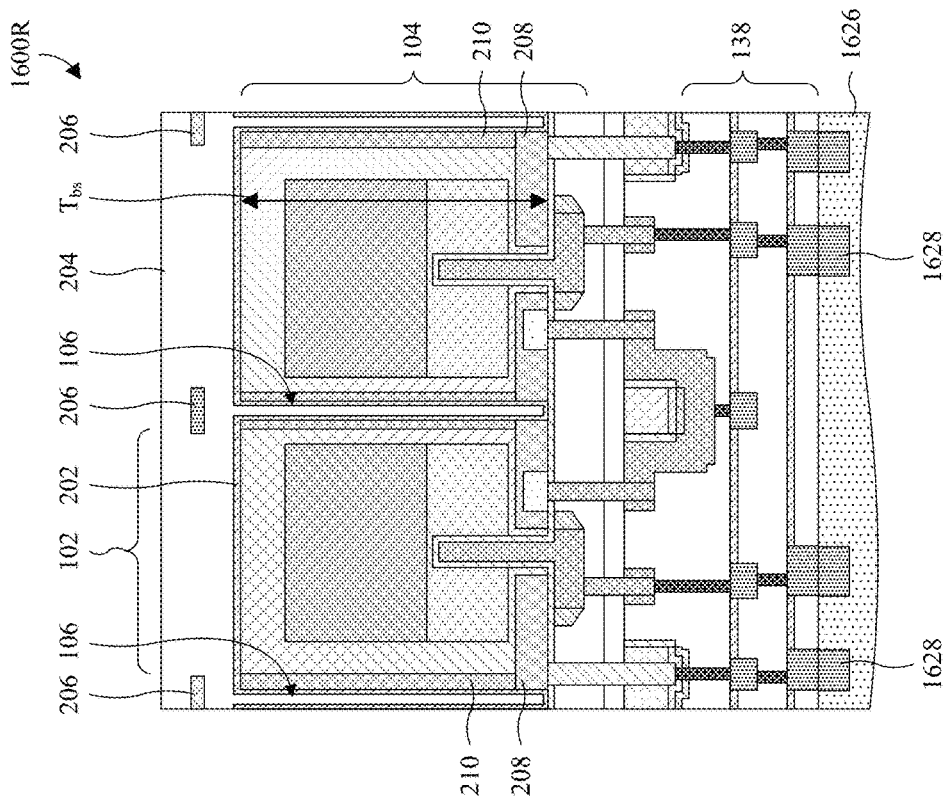

With reference to FIGS. 16A-16R, a series of cross-sectional views 1600A-1600R of some embodiments of a method for forming a SOI DoP image sensor is provided. The method is illustrated using embodiments of the SOI DoP image sensor in FIGS. 2, 3A, and 3B.

As illustrated by the cross-sectional view 1600A of FIG. 16A, a screen oxide layer 1602 is formed on a base substrate 104. The screen oxide layer 1602 may be or comprise, for example, silicon oxide and/or some other suitable oxide, whereas the base substrate 104 may be or comprise, for example, monocrystalline silicon and/or some other suitable semiconductor. The screen oxide layer 1602 may, for example, be formed by thermal oxidation, vapor deposition, or some others suitable deposition and/growth process.

Also illustrated by the cross-sectional view 1600A of FIG. 16A, a series of selective doping processes is performed into the base substrate 104, through the screen oxide layer 1602, to form a shallow well 208', a deep well 210', and collector regions 104c. The shallow well 208' is along a top surface of the base substrate 104 and may, for example, passivate the top surface. The deep well 210' underlies the shallow well 208' and demarcates pixels 102 being formed. The shallow well 208' and the deep well 210' have the same doping type as, but different doping concentrations than, a bulk region 104b of the base substrate 104. For example, the shallow well 208', the deep well 210', and the bulk region 104b may be P-type, and the shallow well 208' and the deep well 210' may have larger doping concentrations than the bulk region 104b.

The collector regions 104c are individual to the pixels 102. The collector regions 104c comprise individual shallow collector regions $104c_1$ and further comprise individual deep collector regions $104c_2$ respectively underlying the shallow collector regions $104c_1$. The shallow and deep collector regions $104c_1$, $104c_2$ share a common doping type but different doping concentrations. Further, the shallow and deep collector regions $104c_1$, $104c_2$ have an opposite doping type as the bulk region 104b of the base substrate 104.

In some embodiments, the selective doping processes are performed by selective ion implantations or some other suitable selective doping processes. For example, a first selective ion implantation may be performed to form the shallow well 208', a second selective ion implantation may subsequently be performed to form the shallow collector regions $104c_1$, a third selective ion implantation may subsequently be performed to form the deep collector regions $104c_2$, and a fourth selective ion implantation may subsequently be performed to form the deep well 210'. A selective ion implantation may, for example, comprise forming a photoresist mask by photolithography, performing ion implantation into the base substrate 104 with the photoresist mask in place, and removing the photoresist mask.

As illustrated by the cross-sectional view 1600B of FIG. 16B, a trench hard mask 1604 is formed on the screen oxide layer 1602. The trench hard mask 1604 has a layout for trenches of transfer gate electrodes being formed. The trench hard mask 1604 may, for example, be formed by depositing a hard mask layer and subsequently patterning the hard mask layer into the trench hard mask 1604. The trench hard mask 1604 may be or comprise, for example, silicon nitride and/or some other suitable hard mask material.

Also illustrated by the cross-sectional view 1600B of FIG. 16B, an etch is performed into the screen oxide layer 1602 and the base substrate 104. The etch is performed with the trench hard mask 1604 in place and forms trenches 302 individual to and respectively at the pixels 102. The trenches 302 may, for example, have a top layout as shown in, for example, FIGS. 3A and 3B. In some embodiments, the first etch forms the trenches 302 with a depth $D_T$ of about 250-450 nanometers (nm), about 250-350 nm, about 350-450 nm, or some other suitable value. Further, in some embodiments, the first etch forms the trenches 302 with a width $W_T$ of about 80-150 nm, about 80-105 nm, about 105-150 nm, or some other suitable value.

As illustrated by the cross-sectional view 1600C of FIG. 16C, a sacrificial oxide layer 1606 is formed on sidewalls of the base substrate 104 in the trenches 302. The sacrificial oxide layer 1606 may be or comprise, for example, silicon oxide and/or some other suitable oxide. The sacrificial oxide layer 1606 may, for example, be formed by thermal oxidation, vapor deposition, or some others suitable deposition and/growth process.

As illustrated by the cross-sectional view 1600D of FIG. 16D, the screen oxide layer 1602 (see FIG. 16C), the trench hard mask 1604 (see FIG. 16C), and the sacrificial oxide layer 1606 (see FIG. 16C) are removed. Removal of the trench hard mask 1604 may, for example, comprise etching into the trench hard mask 1604 using a first etchant (e.g., a dry etchant) and stopping on the screen and sacrificial oxide layers 1602, 1606. Similarly, removal of the screen and sacrificial oxide layers 1602, 1606 may, for example, comprise etching into the screen and sacrificial oxide layers 1602, 1606 using a second etchant (e.g., a wet etchant) and stopping on the base substrate 104. Other removal processes are, however, amenable for the trench hard mask 1604 and the screen and sacrificial oxide layers 1602, 1606.

As illustrated by the cross-sectional view 1600E of FIG. 16E, a transfer gate dielectric layer 114 is formed on the base substrate 104. The transfer gate dielectric layer 114 may be or comprise, for example, silicon oxide and/or some other suitable dielectric. Further, the transfer gate dielectric layer 114 may, for example, be formed by in situ steam generation (ISSG), vapor deposition, or some other suitable growth and/or deposition process.

Also illustrated by the cross-sectional view 1600E of FIG. 16E, a transfer gate layer 1608 is formed over the transfer gate dielectric layer 114. The transfer gate layer 1608 may, for example, be or comprise doped polysilicon and/or some other suitable conductive material(s). The transfer gate layer 1608 may, for example, be formed by vapor deposition and/or some other suitable deposition process.

As illustrated by the cross-sectional view 1600F of FIG. 16F, the transfer gate layer 1608 (see FIG. 16E) is thinned to a thickness $T_{tgl}$. The thinning may, for example, be performed by an etch back, a chemical mechanical planarization (CMP), or some other suitable thinning process. In some embodiments, the thickness $T_{tgl}$ is about 60-150 nm, about 60-105 nm, about 105-150 nm, or some other suitable value.

Also illustrated by the cross-sectional view 1600F of FIG. 16F, the transfer gate layer 1608 (see FIG. 16E) is patterned to form transfer gate electrodes 112 individual to and respectively at the pixels 102. The transfer gate electrodes 112 may, for example, have top layouts as shown in FIGS. 3A and 3B. In some embodiments, a process for patterning the transfer gate layer 1608 comprises: 1) depositing an antireflective coating (ARC); 2) patterning the ARC and the transfer gate layer 1608 by a photolithography/etching process; and 3) removing the ARC. Other processes are, however, amenable.

As illustrated by the cross-sectional view 1600G of FIG. 16G, first-level sidewall spacers 212 are formed on sidewalls of the transfer gate electrodes 112. The first-level sidewall spacers 212 may be or comprise, for example, silicon oxide, silicon nitride, some other suitable dielectric(s), or any combination of the foregoing. In some embodiments, a process for forming the first-level sidewall spacers 212 comprises: 1) depositing an oxide layer over the transfer gate electrodes 112 and the transfer gate dielectric layer 114; 2) depositing a silicon nitride layer over the oxide layer; and 3) etching back the oxide layer and the silicon nitride layers. Other processes are, however, amenable. The depositions may, for example, be performed by vapor deposition and/or some other suitable deposition process(es).

Also illustrated by the cross-sectional view 1600G of FIG. 16G, floating nodes 116 are formed on the shallow well

208'. The floating nodes 116 are individual to and respectively at the pixels 102. The floating nodes 116 may, for example, have top layouts as shown in FIGS. 3A and 3B. The floating nodes 116 may, for example, be formed by selective ion implantation and/or some other suitable selective doping process. Selective ion implantation may, for example, comprise forming a photoresist mask by photolithography, performing ion implantation with the photoresist mask in place, and removing the photoresist mask.

Also illustrated by the cross-sectional view 1600G of FIG. 16G, a first ILD layer 140$ild_1$ is formed over the transfer gate electrodes 112. The first ILD layer 140$ild_1$ may, for example, be or comprise silicon oxide and/or some other suitable dielectric(s). In some embodiments, the first ILD layer 140$ild_1$ is formed with a top surface that is flat or substantially flat. Further, in some embodiments, a thickness $T_{ild}$ of the first ILD layer 140$ild_1$ directly above the transfer gate electrodes 112 is about 60-1500 nm, about 60-810 nm, about 810-1500 nm, or some other suitable value. In some embodiments, a process for forming the first ILD layer 140$ild_1$ comprises: 1) depositing the first ILD layer 140$ild_1$; and 2) performing a planarization into the top surface of the first ILD layer 140$ild_1$.

As illustrated by the cross-sectional view 1600H of FIG. 16H, a mesa substrate 1610 and a second ILD layer 140$ild_2$ are provided. The second ILD layer 140$ild_2$ lines an underside of the mesa substrate 1610 and may, for example, be or comprise silicon oxide and/or some other suitable dielectric(s). The mesa substrate 1610 may, for example, be monocrystalline silicon and/or some other suitable semiconductor. In some embodiments, the mesa substrate 1610 and the base substrate 104 are or comprise the same material.

Also illustrated by the cross-sectional view 1600H of FIG. 16H, the mesa substrate 1610 and the base substrate 104 are bonded together at a bond interface between the first and second ILD layers 140$ild_1$, 140$ild_2$. The bonding may, for example, be performed by fusion bonding and/or some other suitable bonding process.

As illustrated by the cross-sectional view 1600I of FIG. 16I, the mesa substrate 1610 is thinned. In some embodiments, the mesa substrate 1610 is thinned to a thickness $T_{ms}$ of about 60-150 nm, 60-105 nm, 105-150 nm, or some other suitable value. The thinning may, for example, be performed by grinding, a CMP, or some other suitable thinning process.

Also illustrated by the cross-sectional view 1600I of FIG. 16I, a pickup-via hard mask 1612 is formed on the mesa substrate 1610. The pickup-via hard mask 1612 has a layout for pickup vias being formed. The pickup-via hard mask 1612 may, for example, be formed by depositing a hard mask layer and subsequently patterning the hard mask layer into the pickup-via hard mask 1612. The pickup-via hard mask 1612 may be or comprise, for example, silicon oxide and/or some other suitable hard mask material.

Also illustrated by the cross-sectional view 1600I of FIG. 16I, an etch is performed into the mesa substrate 1610, the first and second ILD layers 140$ild_1$, 140$ild_2$, and the transfer gate dielectric layer 114. The etch forms pickup-via openings 1614 individual to and respectively at the pixels 102.

Also illustrated by the cross-sectional view 1600I of FIG. 16I, a seed layer 1616 is formed over the pickup-via hard mask 1612 and lining the pickup-via openings 1614. The seed layer 1616 may, for example, be or comprise polysilicon and/or some other suitable seed layer for subsequently formed pickup vias. Further, the seed layer 1616 may, for example, be formed by vapor depositing and/or some other suitable deposition process.

As illustrated by the cross-sectional view 1600J of FIG. 16J, the seed layer 1616 is etched back to remove lateral segments of the seed layer 1616. The etch back may, for example, use the base substrate 104 and the pickup-via hard mask 1612 as an etch stop.

As illustrated by the cross-sectional view 1600K of FIG. 16K, pickup vias 120 are formed in the pickup-via openings 1614 (see FIG. 16J). The pickup vias 120 may, for example, be or comprise doped monocrystalline silicon and/or some other suitable semiconductor. In some embodiments, the pickup vias 120 have the same doping type as the bulk region 104*b* of the base substrate 104. The pickup vias 120 may, for example, be formed by a selective epitaxial process that grows the pickup vias 120 from the seed layer 1616 (not shown) and hence consumes the seed layer 1616. Other processes are, however, amenable.

Also illustrated by the cross-sectional view 1600K of FIG. 16K, the pickup-via hard mask 1612 is removed after forming the pickup vias 120. The pickup vias 120 may, for example, have top layouts as shown in FIGS. 3A and 3B. The removal may, for example, be performed by an etch and/or some other suitable removal process.

Also illustrated by the cross-sectional view 1600K of FIG. 16K, the mesa substrate 1610 (see FIG. 16J) is patterned to form a plurality of mesas 118. The plurality of mesas 118 comprises a device mesa 118*d* and a plurality of pickup mesas 118*p*, which may, for example, have top layouts as shown in FIGS. 3A and 3B. The pickup mesas 118*p* are individual to and respectively surround the pickup vias 120. In some embodiments, a process for patterning the mesa substrate 1610 comprises: 1) forming mesa hard mask structures 214 on the mesa substrate 1610; and 2) performing an etch into the mesa substrate 1610 with the mesa hard mask structures 214 in place. Other processes for patterning the mesa substrate 1610 are, however, amenable. The mesa hard mask structures 214 may be or comprise, for example, silicon oxide, silicon nitride, some other suitable dielectric(s), or any combination of the foregoing. In some embodiments, the mesa hard mask structures 214 each comprise a lower mesa hard mask layer 214*l* and further comprise an upper mesa hard mask layer 214*u*. The lower and upper mesa hard mask layers 214*l*, 214*u* may respectively be silicon oxide and silicon nitride, but other materials are, however, amenable for the lower and upper mesa hard mask layers 214*l*, 214*u*. In some embodiments, the mesa hard mask structures 214 are formed by depositing hard mask layers and subsequently patterning the hard mask layers into the mesa hard mask structures 214.

As illustrated by the cross-sectional view 1600L of FIG. 16L, a gate dielectric layer 126 and pickup-mesa dielectric layers 216 are respectively formed on sidewalls of the device mesa 118*d* and the pickup mesas 118*p*. The gate dielectric layer 126 and the pickup-mesa dielectric layers 216 may, for example, be formed simultaneously by thermal oxidation and/or some other suitable growth and/or deposition process(es).

Also illustrated by the cross-sectional view 1600L of FIG. 16L, a first polysilicon layer 1618 is formed covering the mesas 118 and the mesa hard mask structures 214. In some embodiments, the first polysilicon layer 1618 is doped. The first polysilicon layer 1618 may, for example, be formed by vapor deposition and/or some other suitable deposition process(es). In some embodiments, the first polysilicon layer 1618 has a thickness $T_{fp1}$ of about 60-150 nm, about 60-105 nm, about 105-150 nm, or some other suitable value.

As illustrated by the cross-sectional view 1600M of FIG. 16M, a contact-via hard mask 1620 is formed over the first polysilicon layer 1618. The contact-via hard mask 1620 has a layout for first-level contact vias being formed. The contact-via hard mask 1620 may, for example, be formed by depositing a hard mask layer and subsequently patterning the hard mask layer into the contact-via hard mask 1620. The contact-via hard mask 1620 may be or comprise, for example, silicon oxide and/or some other suitable hard mask material.

Also illustrated by the cross-sectional view 1600M of FIG. 16M, an etch is performed into the first polysilicon layer 1618, the first and second ILD layers 140$ild_1$, 140$ild_2$, and the transfer gate dielectric layer 114 with the contact-via hard mask 1620 in place. The etch forms contact-via openings 1622 individual to and respectively at the transfer gate electrodes 112 and the floating nodes 116. In some embodiments, a width $W_{cv}$ of the contact-via openings 1622 is about 60-120 nm, about 60-100 nm, about 100-120 nm, or some other suitable value.

As illustrated by the cross-sectional view 1600N of FIG. 16N, a second polysilicon layer 1624 is formed in the contact-via openings 1622 (see FIG. 16M), thereby defining inter-device contact vias 130 extending from the first polysilicon layer 1618 to the transfer gate electrodes 112 and the floating nodes 116. In some embodiments, the second polysilicon layer 1624 is doped with the same doping type as the first polysilicon layer 1618. A process for forming the second polysilicon layer 1624 may, for example, comprise depositing the second polysilicon layer 1624 and etching back the second polysilicon layer 1624. Other processes are, however, amenable. The depositing may, for example, be performed by vapor deposition and/or some other suitable deposition process.

Also illustrated by the cross-sectional view 1600N of FIG. 16N, the contact-via hard mask 1620 is removed. The removal may, for example, be performed after forming the second polysilicon layer 1624. Further, the removal may, for example, be performed by an etch and/or some other suitable removal process.

As illustrated by the cross-sectional view 1600O of FIG. 16O, the first polysilicon layer 1618 is patterned to form a source-follower gate electrode 124 and a plurality of inter-level pads 128. The source-follower gate electrode 124 and the inter-level pads 128 may, for example, have top layouts as shown in FIGS. 3A and 3B. In some embodiments, a process for patterning the first polysilicon layer 1618 comprises: 1) depositing an ARC 2) patterning the ARC and the first polysilicon layer 1618 by a photolithography/etching process; and 3) removing the ARC. Other processes are, however, amenable.

Also illustrated by the cross-sectional view 1600O of FIG. 16O, buffer layers 220 are formed respectively on the inter-level pads 128 and the source-follower gate electrode 124. Further, a third ILD layer 140$ild_3$ is formed over the buffer layers 220. The buffer layers 220 and/or the third ILD layer 140$ild_3$ may, for example, be or comprise silicon oxide and/or some other suitable dielectric(s). In some embodiments, the buffer layers 220 are formed by thermal oxidation and/or some other suitable growth and/or deposition process. In some embodiments, a process for forming the third ILD layer 140$ild_3$ comprises: 1) depositing the third ILD layer 140$ild_3$; and 2) performing a planarization into a top surface of the third ILD layer 140$ild_3$.

While not shown, between the forming of the buffer layers 220 and the forming of the third ILD layer 140$ild_3$, source/drain regions 308 (see FIG. 3B) are formed in the device mesa 118*d*. The source/drain regions 308 may, for example, be formed by: 1) selective ion implantation or some other suitable selective doping process; and 2) annealing.

As illustrated by the cross-sectional view 1600P of FIG. 16P, an interconnect structure 138 is formed over the third ILD layer 140$ild_3$. The interconnect structure 138 comprises a plurality of wires 132, a plurality of interconnect contact vias 134, and a plurality of inter-wire vias 136. The interconnect contact vias 134 extend respectively from the wires 132 respectively to the inter-level pads 128 and the source-follower gate electrode 124. The inter-wire vias 136 extend between wires at different levels above the third ILD layer 140$ild_3$. The wires 132, the interconnect contact vias 134, and the inter-wire vias 136 are or comprise, for example, aluminum, copper, aluminum copper, tungsten, some other suitable metal(s), or any combination of the foregoing.

Also illustrated by the cross-sectional view 1600P of FIG. 16P, a plurality of etch stop layers 218 and a plurality of IMD layers 140*imd* are formed stacked over the third ILD layer 140$ild_3$. The etch stop layers 218 separate the IMD layers 140*imd* from each other and further separate the IMD layers 140*imd* from the third ILD layer 140$ild_3$. Further, the etch stop layers 218 and the IMD layers 140*imd* are formed while forming the interconnect structure 138.

Figure 16Q:
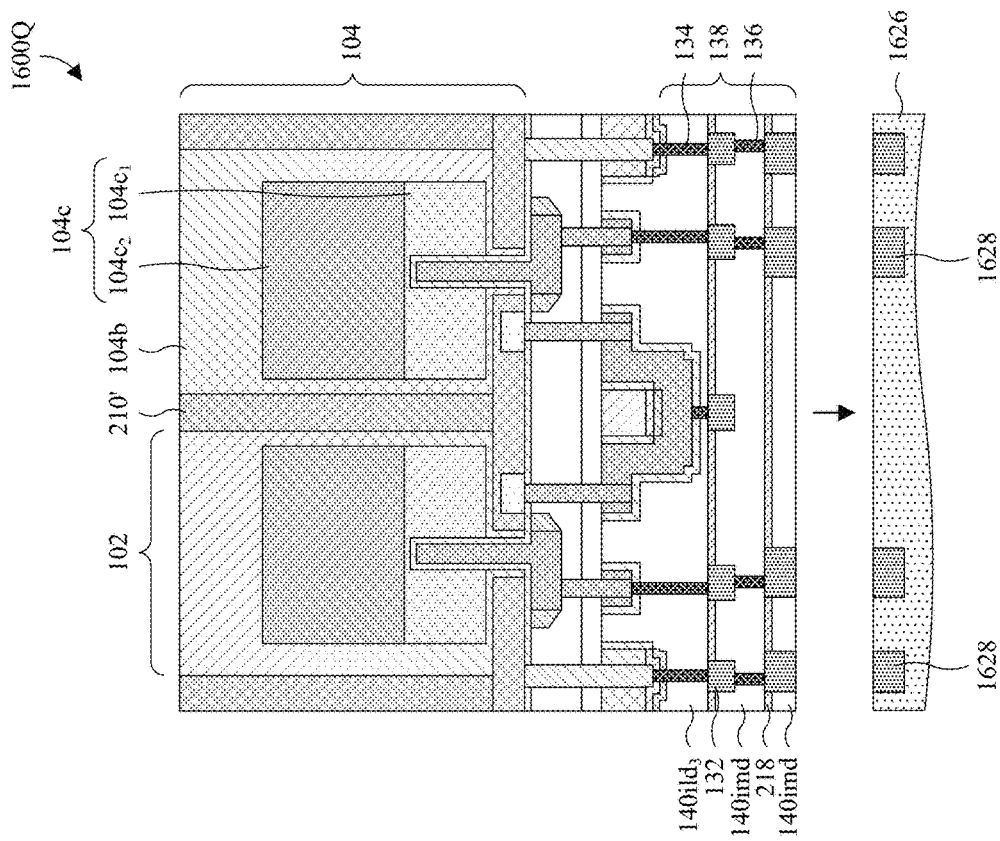

As illustrated by the cross-sectional view 1600Q of FIG. 16Q, the structure of FIG. 16P is flipped vertically and bonded to an integrated circuit (IC) chip 1626. The bonding may, for example, be or comprise hybrid bonding or some other suitable bonding. The IC chip 1626 is only partially shown but comprises a plurality of wires 1628 along a top surface. The wires 1628 of the IC chip 1626 are complementary to the wires 132 of the interconnect structure 138 and provide electrically coupling between the interconnect structure 138 and the IC chip 1626.

As illustrated by the cross-sectional view 1600R of FIG. 16R, the base substrate 104 is thinned to reduce a thickness $T_{bs}$ of the base substrate 104. The thinning may, for example, be performed by a CMP or some other suitable thinning process.

Also illustrated by the cross-sectional view 1600R of FIG. 16R, a backside dielectric liner 202 and a backside dielectric layer 204 are formed covering a backside of the base substrate 104. Further, the backside dielectric liner 202 and the backside dielectric layer 204 protrude into the base substrate 104, from the backside of the base substrate 104 to a frontside of the base substrate 104, to define a full-depth BDTI structure 106. The full-depth BDTI structure 106 demarcates the pixels 102 and divides the shallow and deep wells 208', 210' (see FIG. 16R) into shallow cell wells 208 and deep cell wells 210. The shallow cell wells 208 are individual to and respectively at the pixels 102. Similarly, the deep cell wells 210 are individual to and respectively at the pixels 102.

In some embodiments, a process for forming the backside dielectric liner 202 and a backside dielectric layer 204 comprises: 1) patterning the backside of the base substrate 104; 2) deposing the backside dielectric liner 202; and 3) deposing the backside dielectric layer 204. Other processes are, however, amenable.

Also illustrated by the cross-sectional view 1600R of FIG. 16R, shielding 206 is formed in the backside dielectric layer 204 while forming the backside dielectric layer 204. For example, a first segment of the backside dielectric layer 204 may be deposited, the shielding 206 may be formed, and a second segment of the backside dielectric layer 204 may be deposited on the shielding 206 and the first segment.

While FIGS. 16A-16R are described with reference to a method, it will be appreciated that the structures shown in FIGS. 16A-16R are not limited to the method but rather may stand alone separate of the method. Further, while FIGS. 16A-16R are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

With reference to FIGS. 17A-17K, a series of cross-sectional views 1700A-1700K of some alternative embodiments of the method of FIGS. 16A-16R is provided in which pickup mesas 118p are omitted. The method is illustrated using embodiments of the SOI DoP image sensor in FIGS. 7, 8A, and 8B.

Figure 17B:
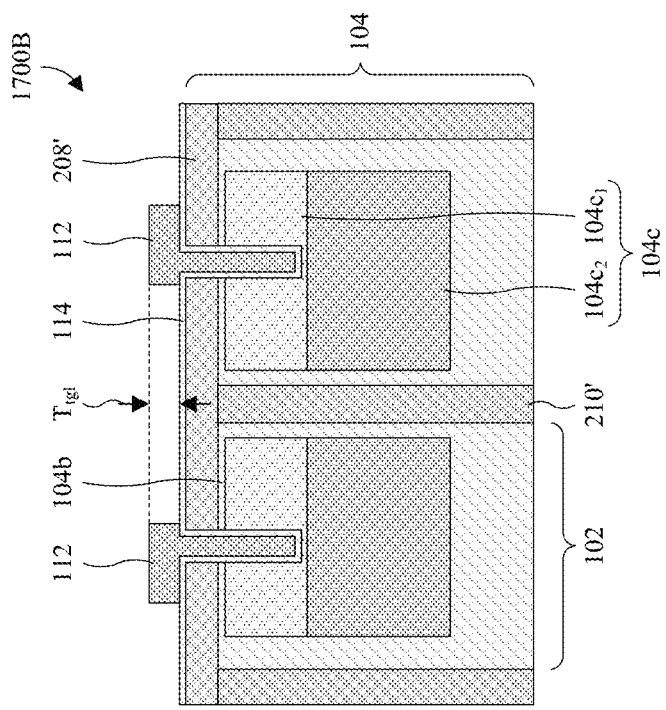
FIGS. 17A-17K illustrate a series of cross-sectional views of some alternative embodiments of the method of FIGS. 16A-16R in which pickup mesas are omitted.
Figure 17A:
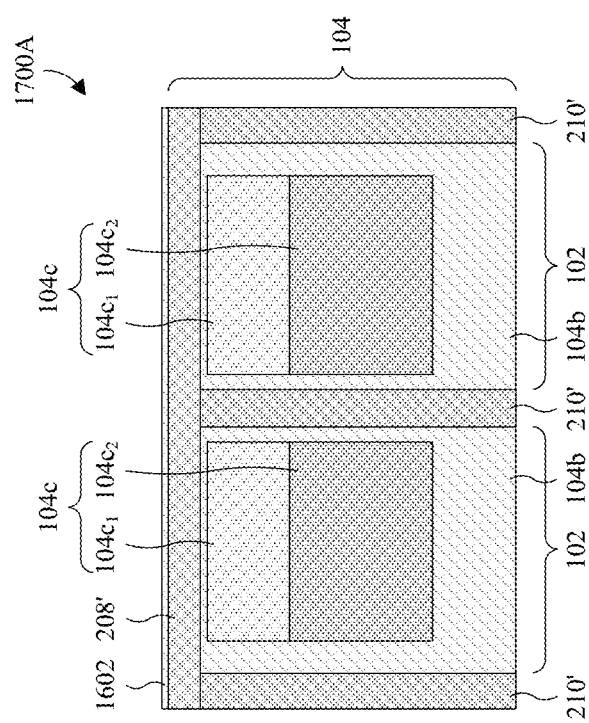

As illustrated by the cross-sectional view 1700A of FIG. 17A, a screen oxide layer 1602 is formed on a base substrate 104. Further, a series of doping processes is performed into the base substrate 104, through the screen oxide layer 1602, to form a shallow well 208', a deep well 210', and collector regions 104c. The screen oxide layer 1602 may, for example, be performed as described with regard to FIG. 16A. Further, the series of doping processes may, for example, be performed as described with regard to FIG. 16A, except that the doping process for forming the shallow well 208' is not performed selectively. Instead, the doping process for forming the shallow well 208' blankets a top surface of the base substrate 104.

As illustrated by the cross-sectional view 1700B of FIG. 17B, a transfer gate dielectric layer 114 and transfer gate electrodes 112 are formed over the base substrate 104 and protruding into the base substrate 104 when viewed in cross section. The transfer gate dielectric layer 114 and the transfer gate electrode 112 may, for example, be formed as described with regard to FIGS. 16B-16F. Further, the transfer gate electrodes 112 may, for example, have top layouts as shown in FIGS. 8A and 8B.

Figure 17D:
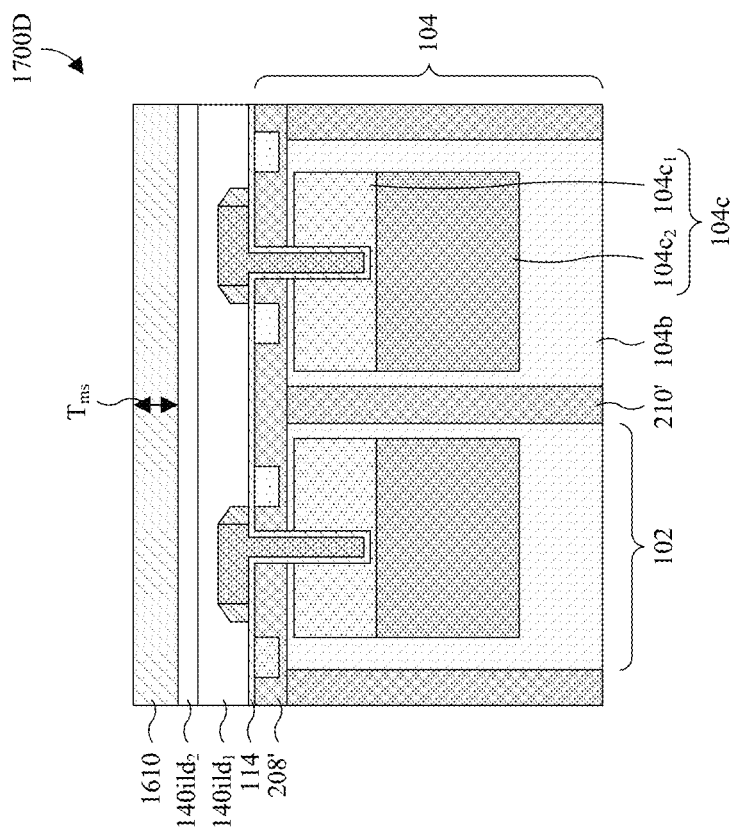
Figure 17C:
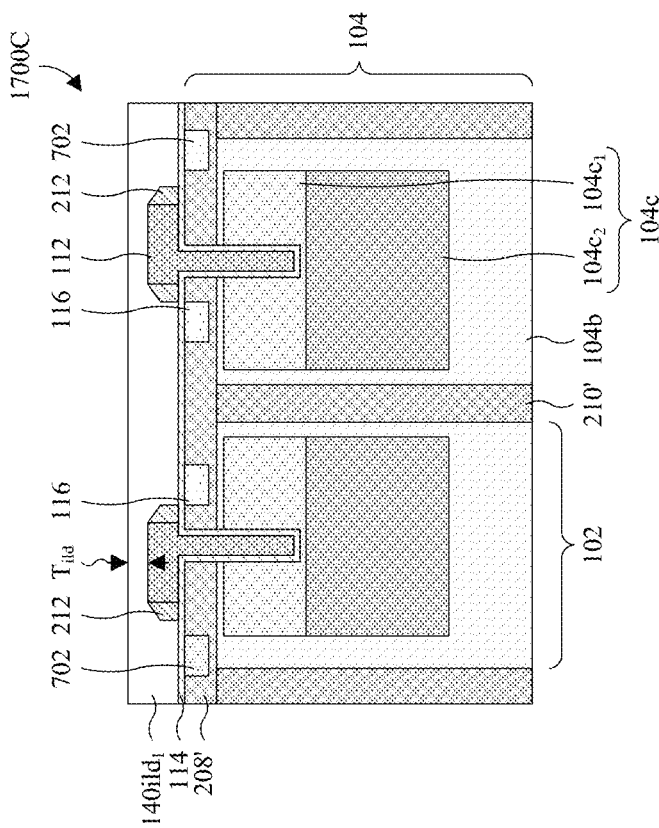

As illustrated by the cross-sectional view 1700C of FIG. 17C, first-level sidewall spacers 212 are formed on sidewalls of the transfer gate electrodes 112. The first-level sidewall spacers 212 may, for example, be formed as described with regard to FIG. 16G.

Also illustrated by the cross-sectional view 1700C of FIG. 17C, floating nodes 116 and pickup regions 702 are formed on the shallow well 208'. In alternative embodiments, the pickup regions 702 are not formed. The floating nodes 116 and the pickup regions 702 are individual to and respectively at the pixels 102. The floating nodes 116 and the pickup regions 702 may, for example, have top layouts as shown in FIGS. 8A and 8B. The floating nodes 116 have an opposite doping type as the shallow well 208', whereas the pickup regions 702 have the same doping type as the shallow well 208'. The floating nodes 116 and the pickup regions 702 may, for example, be formed by selective ion implantation and/or some other suitable selective doping process(es).

Also illustrated by the cross-sectional view 1700C of FIG. 17C, a first ILD layer 140$ild_1$ is formed over the transfer gate electrodes 112. The first ILD layer 140$ild_1$ may, for example, be form as described with regard to FIG. 16G.

As illustrated by the cross-sectional view 1700D of FIG. 17D, a mesa substrate 1610 is bonded to and thinned on the base substrate 104. The bonding and thinning may, for example, be performed as described with regard to FIGS. 16H and 16I.

Figure 17F:
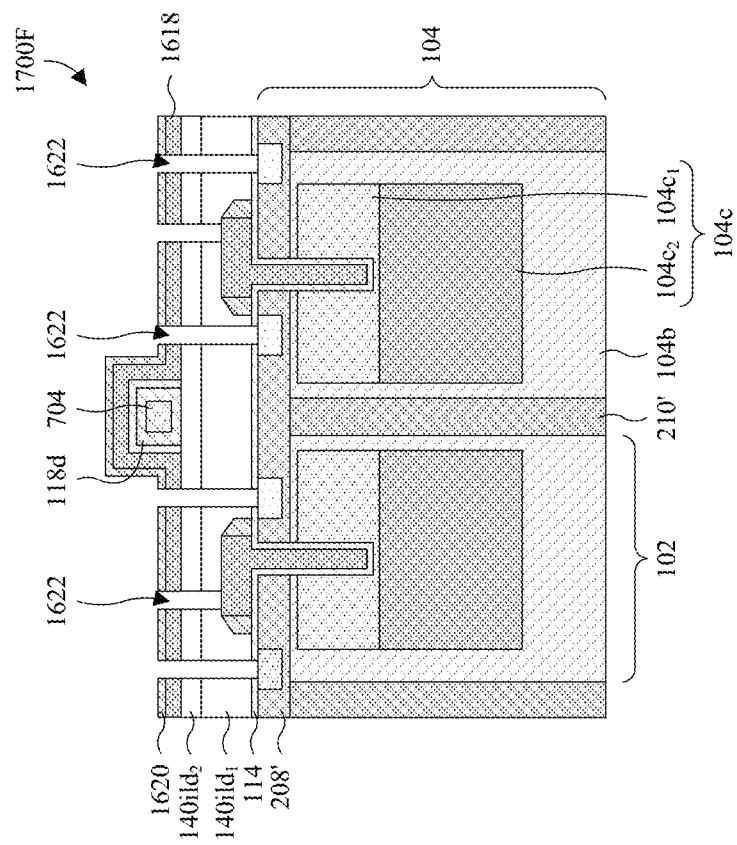
Figure 17E:
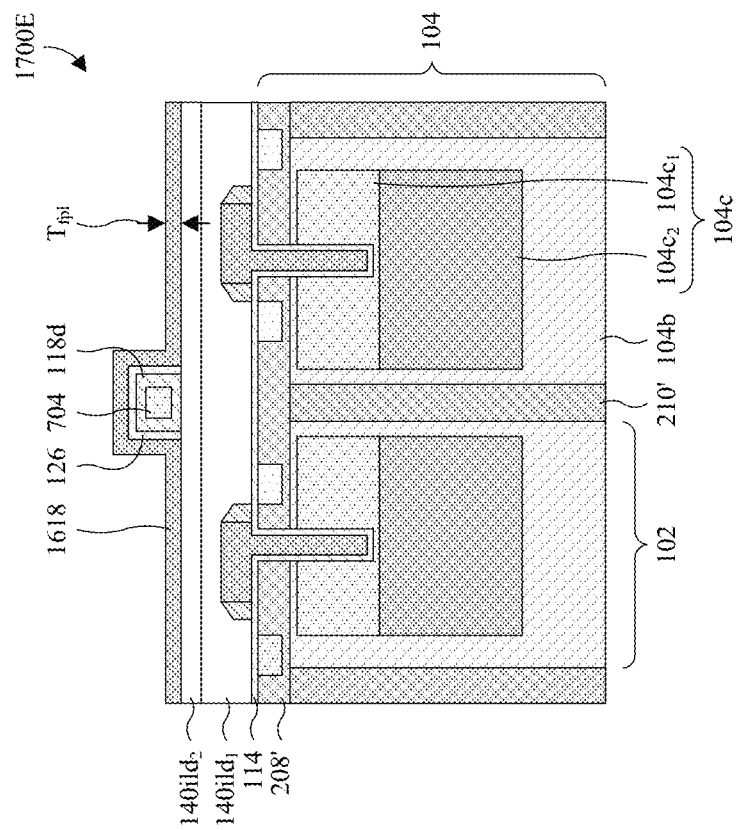

As illustrated by the cross-sectional view 1700E of FIG. 17E, a buried channel region 704 is formed in the mesa substrate 1610 (see FIG. 17D). The buried channel region 704 has an opposite doping type as a bulk region of the mesa substrate 1610. For example, the buried channel region 704 may be P-type, whereas the bulk region may be N-type, or vice versa. The buried channel region 704 may, for example, be formed by selective ion implantation and/or some other suitable selective doping process. A selective ion implantation may, for example, comprise forming a photoresist mask by photolithography, performing ion implantation with the photoresist mask in place, and removing the photoresist mask.

Also illustrated by the cross-sectional view 1700E of FIG. 17E, the mesa substrate 1610 (see FIG. 17D) is patterned to form a device mesa 118d. The device mesa 118d may, for example, have a top layout as shown in FIGS. 8A and 8B. The patterning may, for example, be performed by a photolithography/etching process and/or some other suitable patterning process.

As illustrated by the cross-sectional view 1700E of FIG. 17E, a gate dielectric layer 126 is formed on the device mesa 118d. The gate dielectric layer 126 may, for example, be formed by thermal oxidation and/or some other suitable growth and/or deposition process(es).

Also illustrated by the cross-sectional view 1700E of FIG. 17E, a first polysilicon layer 1618 is formed covering the device mesa 118d. In some embodiments, the first polysilicon layer 1618 has a thickness $T_{fpl}$ of about 20-130 nm, about 20-75 nm, about 75-130 nm, or some other suitable value. In some embodiments, the first polysilicon layer 1618 is undoped.

As illustrated by the cross-sectional view 1700F of FIG. 17F, a contact-via hard mask 1620 is formed over the first polysilicon layer 1618. Further, an etch is performed into the first polysilicon layer 1618, the first and second ILD layers 140$ild_1$, 140$ild_2$, and the transfer gate dielectric layer 114 with the contact-via hard mask 1620 in place to form contact-via openings 1622. The contact-via hard mask 1620 may, for example, be formed as described with regard to FIG. 16M and the etch may, for example, be performed as described with regard to FIG. 16M.

Figure 17H:
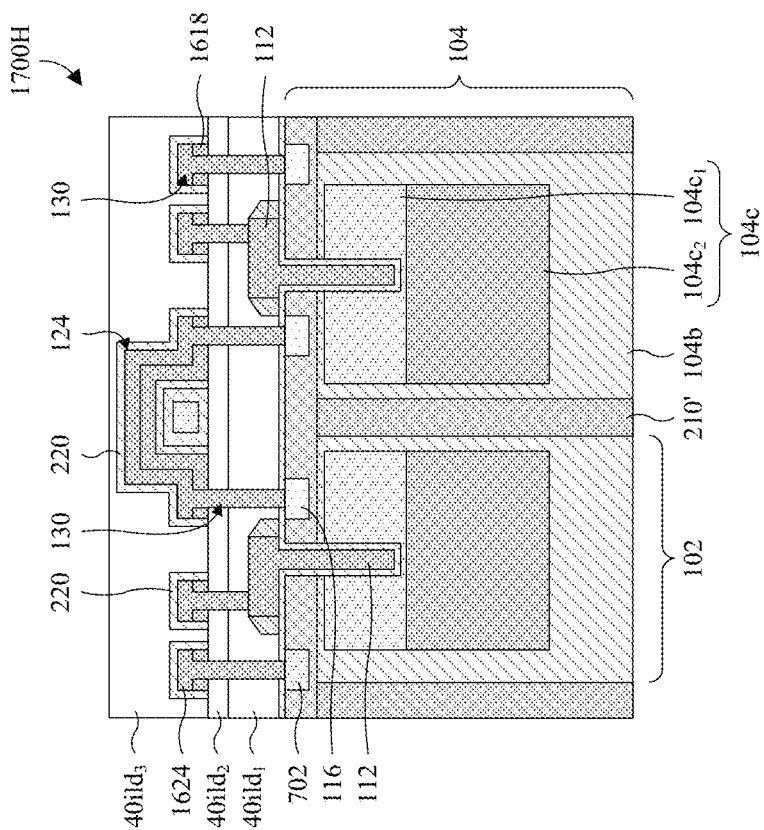
Figure 17G:
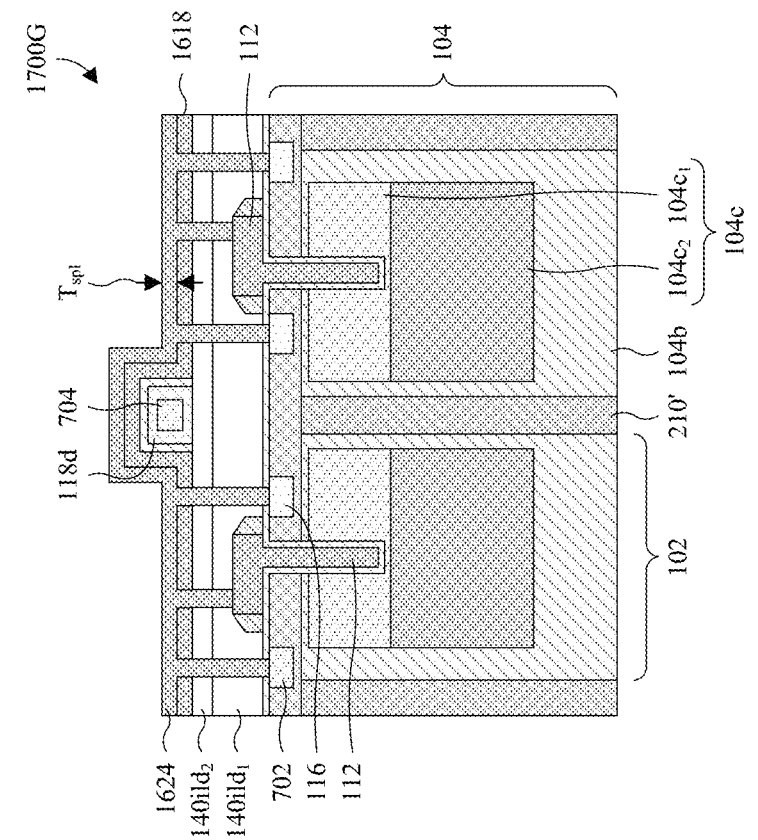

As illustrated by the cross-sectional view 1700G of FIG. 17G, the contact-via hard mask 1620 is removed. The removal may, for example, be performed by an etching process and/or some other suitable removal process.

Also illustrated by the cross-sectional view 1700G of FIG. 17G, a second polysilicon layer 1624 is formed covering the first polysilicon layer 1618 and filling the contact-via openings 1622. In some embodiments, the second polysilicon layer 1624 is formed with a thickness $T_{spl}$ of about 20-130 nm, about 20-75 nm, about 75-130 nm, or some other suitable value. The second polysilicon layer 1624 defines inter-device contact vias 130 extending from the first polysilicon layer 1618 to the transfer gate electrodes 112, the floating nodes 116, and the pickup regions 702. The second polysilicon layer 1624 may, for example, be doped polysilicon and/or some other suitable material. The second polysilicon layer 1624 may, for example, be formed by vapor deposition and/or some other suitable deposition process.

While not shown, after the second polysilicon layer 1624 is formed, the first polysilicon layer 1618 and the second polysilicon layer 1624 are doped and subsequently annealed. For example, portions respectively of the first and second polysilicon layers 1618, 1624 may be doped with N-type dopants, whereas a remainder of the first and second polysilicon layers 1618, 1624 may be doped with P-type dopants.

As illustrated by the cross-sectional view 1700H of FIG. 17H, the first polysilicon layer 1618 and the second polysilicon layer 1624 are patterned to form a source-follower gate electrode 124 and a plurality of inter-level pads 128.

The source-follower gate electrode 124 and the inter-level pads 128 may, for example, have top layouts as shown in FIGS. 8A and 8B. In some embodiments, a process for patterning the first and second polysilicon layers 1618, 1624 comprises: 1) depositing an ARC 2) patterning the ARC and the first and second polysilicon layers 1618, 1624 by a photolithography/etching process; and 3) removing the ARC. Other processes are, however, amenable.

Also illustrated by the cross-sectional view 1700H of FIG. 17H, buffer layers 220 are formed respectively on the inter-level pads 128 and the source-follower gate electrode 124. Further, a third ILD layer 140$ild_3$ is formed over the buffer layers 220. The buffer layers 220 and/or the third ILD layer 140$ild_3$ may, for example, be formed as described with regard to FIG. 16O. While not shown, between the forming of the buffer layers 220 and the forming of the third ILD layer 140$ild_3$, source/drain regions 308 (see FIG. 8B) are formed in the device mesa 118d. The source/drain regions 308 may, for example, be formed by: 1) selective ion implantation or some other suitable selective doping process; and 2) annealing.

Figure 17J:
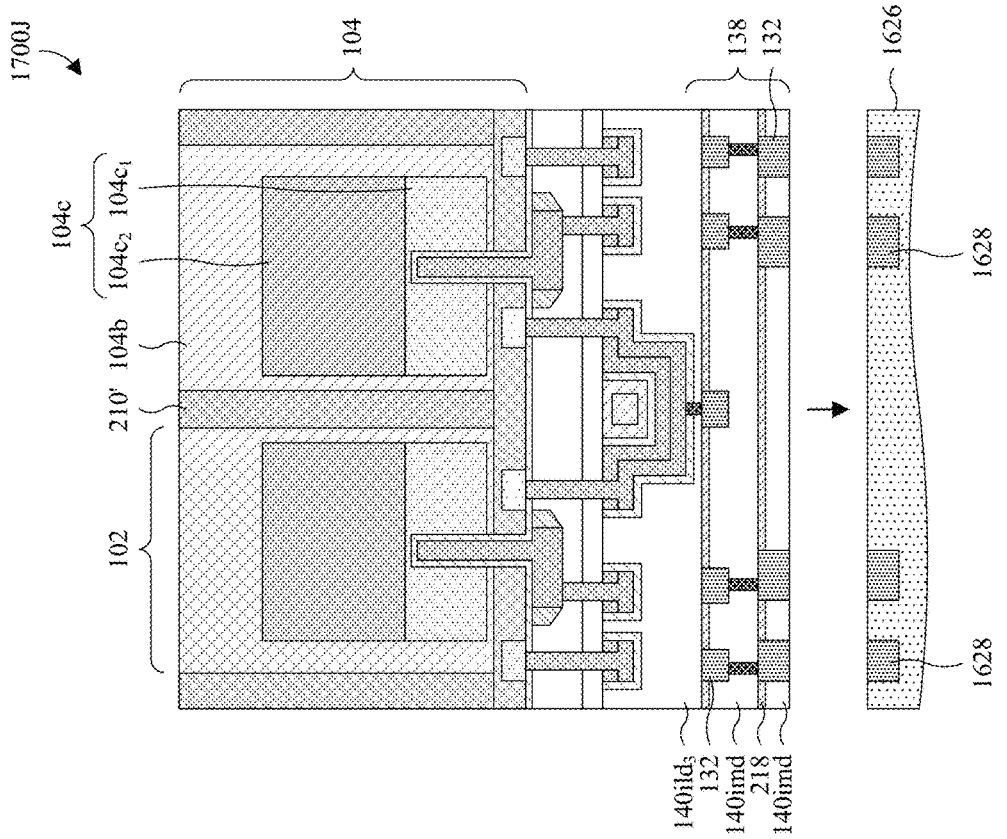
Figure 17I:
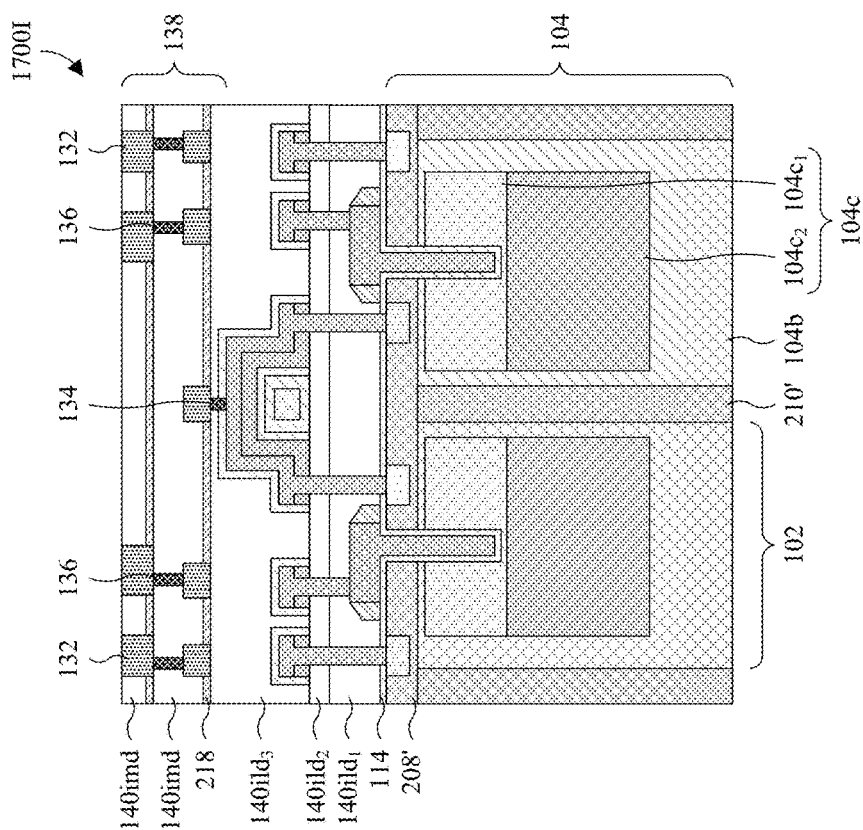

As illustrated by the cross-sectional view 1700I of FIG. 17I, an interconnect structure 138 is formed over the third ILD layer 140$ild_3$, surrounded by a plurality of etch stop layers 218 and a plurality of IMD layers 140$imd$. The interconnect structure 138, the etch stop layers 218, and the IMD layers 140$imd$ may, for example, be formed as described with regard to FIG. 16P.

As illustrated by the cross-sectional view 1700J of FIG. 17J, the structure of FIG. 17I is flipped vertically and bonded to an integrated circuit (IC) chip 1626. The bonding may, for example, be as described with regard to FIG. 16Q.

Figure 17K:
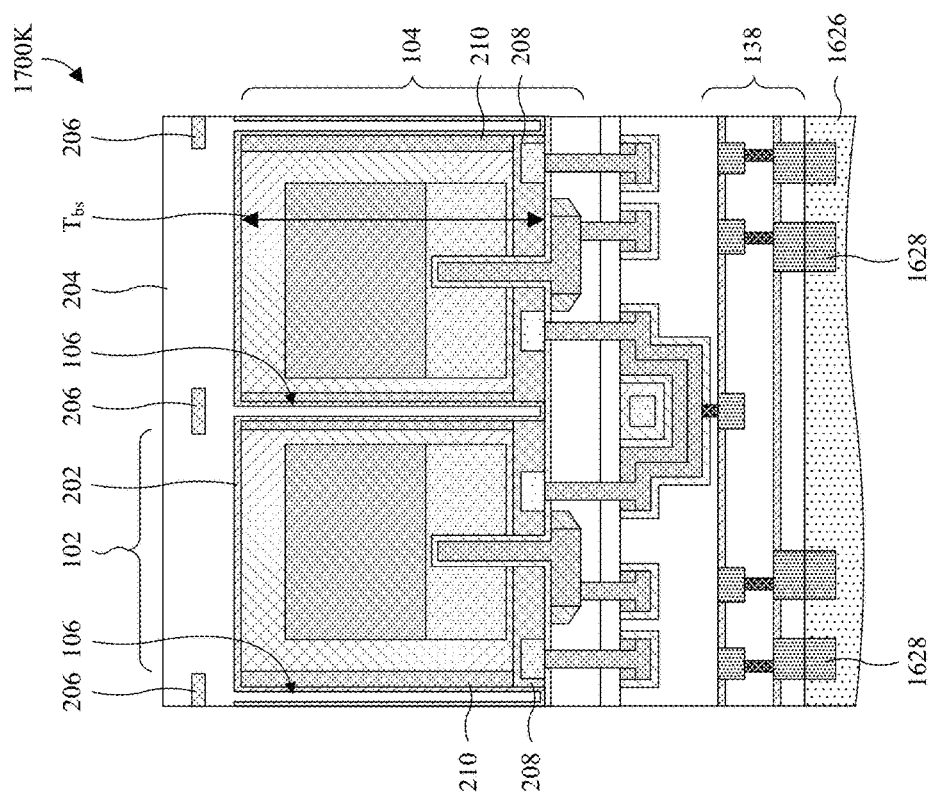

As illustrated by the cross-sectional view 1700K of FIG. 17K, the base substrate 104 is thinned to reduce a thickness $T_{bs}$ of the base substrate 104. Further, a backside dielectric liner 202, a backside dielectric layer 204, and shielding 206 are formed covering a backside of the base substrate 104. The thinning and the forming may, for example, be performed as described with regard to FIG. 16R.

While FIGS. 17A-17K are described with reference to a method, it will be appreciated that the structures shown in FIGS. 17A-17K are not limited to the method but rather may stand alone separate of the method. Further, while FIGS. 17A-17K are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 18:
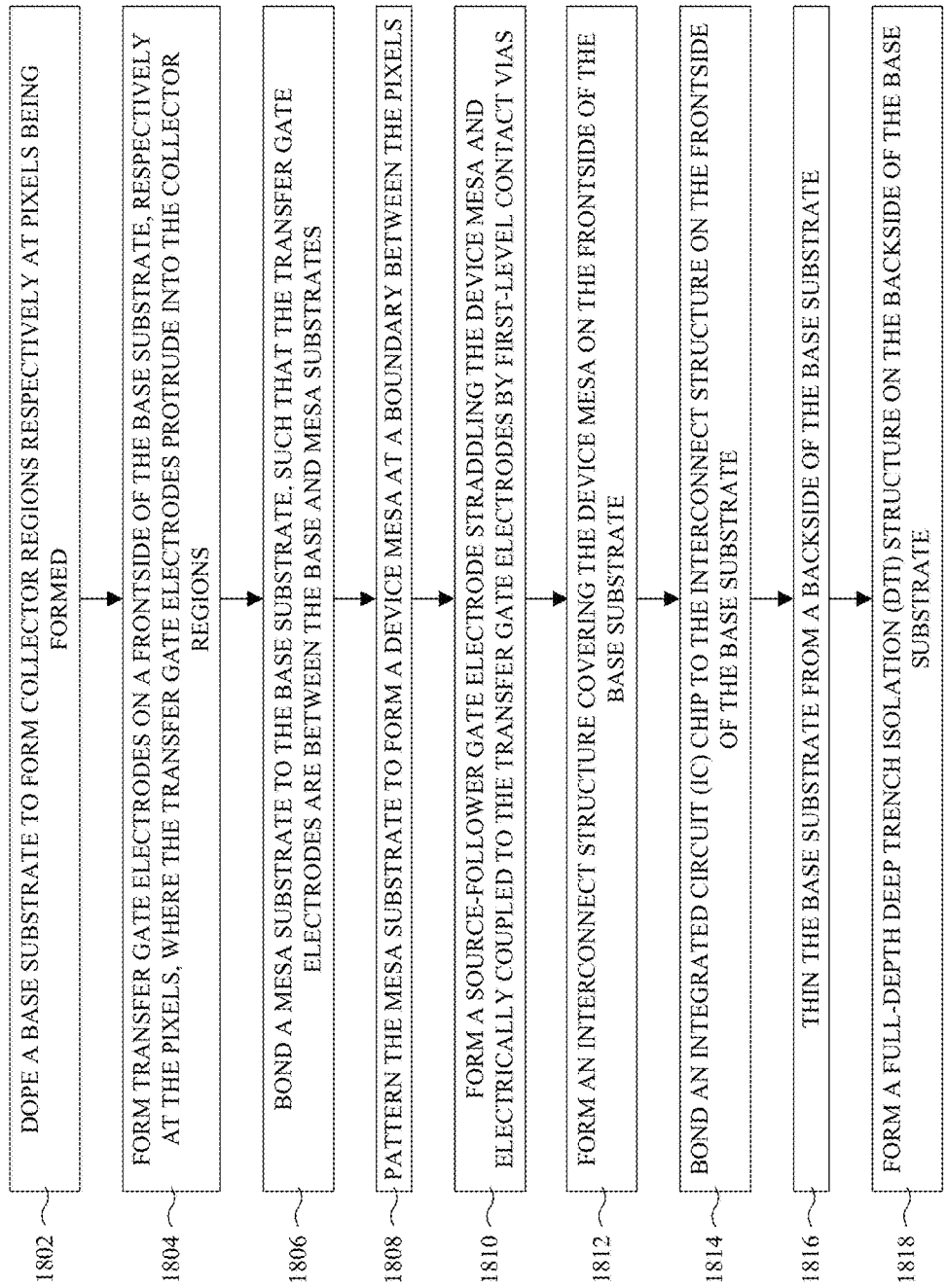
FIG. 18 illustrates a block diagram of some embodiments of the method of FIGS. 16A-16R and FIGS. 17A-17K.

With reference to FIG. 18, a block diagram 1800 of some embodiments of the method of FIGS. 16A-16R and 17A-17K is provided.

At 1802, a base substrate is doped to form collector regions respectively at pixels being formed. See, for example, FIGS. 16A and 17A.

At 1804, transfer gate electrodes are formed on a frontside of the base substrate, respectively at the pixels, where the transfer gate electrodes protrude into the collector regions. See, for example, FIGS. 16B-16F and FIG. 17B.

At 1806, a mesa substrate is bonded to the base substrate, such that the transfer gate electrodes are between the base and mesa substrates. See, for example, FIGS. 16G and 16H and FIGS. 17C and 17D.

At 1808, the mesa substrate is patterned to form a device mesa at a boundary between the pixels. See, for example, FIGS. 16K and 17E.

In some embodiments, such as for embodiments of the method described at FIGS. 16A-16R, pickup vias are formed extending through the mesa substrate, respectively at the pixels. See, for example, FIGS. 16I-16K. Further, the mesa substrate is patterned to further form pickup mesas surrounding the pickup vias. See, for example, FIG. 16L.

At 1810, a source-follower gate electrode is formed straddling the device mesa and electrically coupled to the transfer gate electrodes by first-level contact vias. See, for example, FIGS. 16L-16O and FIGS. 17E-17H.

At 1812, an interconnect structure is formed covering the device mesa on the frontside of the base substrate. See, for example, FIGS. 16P and 17I.

At 1814, an IC chip is bonded to the interconnect structure on the frontside of the base substrate. See, for example, FIGS. 16Q and 17J.

At 1816, the base substrate is thinned from a backside of the base substrate. See, for example, FIGS. 16R and 17K.

At 1818, a full-depth DTI structure is formed on the backside of the base substrate. See, for example, FIGS. 16R and 17K.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated image sensor chip including: a semiconductor substrate including a floating node and a collector region; a photodetector in the semiconductor substrate, wherein the photodetector is defined in part by a collector region; a transfer transistor over the semiconductor substrate, wherein the collector region and the floating node respectively define source/drain regions of the transfer transistor; a semiconductor mesa over and spaced from the semiconductor substrate; a readout transistor on and partially defined by the semiconductor mesa, wherein the semiconductor mesa is between the readout transistor and the semiconductor substrate; and a via extending from the floating node and electrically coupled to the readout transistor. In some embodiments, the transfer transistor is an N-channel FET and the readout transistor is a P-channel FET. In some embodiments, the readout transistor includes a gate electrode and the via extends from the floating node to the gate electrode. In some embodiments, the integrated image sensor chip further includes a trench isolation structure extending completely through the semiconductor substrate, wherein semiconductor mesa is directly over the trench isolation structure. In some embodiments, the collector region is completely spaced below a top surface of the semiconductor substrate, wherein the transfer transistor includes a gate electrode having a protrusion protruding into the semiconductor substrate, and wherein the collector region wraps around a bottom of the protrusion. In some embodiments, the via includes doped polysilicon. In some embodiments, the readout transistor includes a gate electrode, and the integrated image sensor chip further includes: an interconnect structure including a plurality of wires and a plurality of vias that are stacked over the semiconductor substrate and the semiconductor mesa, wherein the plurality of vias includes the via and a second via, wherein the plurality of wires includes a wire, and wherein the via and the second via extend from the wire respectively to the floating node and the gate electrode. In some embodiments, the integrated image sensor chip further includes: a second semiconductor mesa over and spaced from the semiconductor substrate and at a same level above the semiconductor substrate as the semiconductor mesa; and a second via extending from the semiconductor substrate to the second semiconductor mesa, wherein the second via includes a semiconductor material. In some embodiments, the integrated image sensor chip further includes a second readout transistor on and partially defined by the semiconductor mesa, wherein the readout transistor and the second readout transistor share a common source/drain region in the semiconductor mesa. In some embodiments, the readout transistor includes a gate electrode to which the via extends, wherein the integrated image sensor chip further includes: a second semiconductor mesa over and spaced from the semiconductor substrate, wherein the semiconductor mesa and the second semiconductor mesa are laterally elongated respectively in orthogonal directions; and a second readout transistor on and partially defined by the second semiconductor mesa, wherein the second readout transistor includes a source/drain region electrically coupled to the floating node.

In some embodiments, the present application provides a method for forming an integrated image sensor chip including: forming a first photodetector and a second photodetector neighboring in a first semiconductor substrate; forming a first transfer transistor and a second transfer transistor on and partially defined by the first semiconductor substrate, wherein the first and second transfer transistors are respectively at and electrically coupled to the first and second photodetectors; depositing a dielectric layer covering the first and second transfer transistors; bonding a second semiconductor substrate to the first semiconductor substrate through the dielectric layer; performing a first selective etch into the second semiconductor substrate to form a semiconductor mesa between and neighboring the first and second photodetectors; and forming a readout transistor on and partially defined by the semiconductor mesa, wherein the readout transistor is electrically coupled to the first and second transfer transistors. In some embodiments, the method further includes: performing a second selective etch into the second semiconductor substrate and the dielectric layer to form an opening exposing the first semiconductor substrate at the first photodetector; and epitaxially growing a semiconductor layer in the opening, wherein the first selective etch further forms a second semiconductor mesa surrounding and directly contacting the semiconductor layer. In some embodiments, the forming of the readout transistor includes: depositing a first polysilicon layer covering the semiconductor mesa; performing a second selective etch into the first polysilicon layer and the dielectric layer to form a first opening and a second opening respectively and partially exposing the first and second transfer transistors; depositing a second polysilicon layer filling the first and second openings, wherein the second polysilicon layer defines a pair of vias in the first and second openings; and performing a third selective etch into the first polysilicon layer to form a gate electrode of the readout transistor, wherein the gate electrode is electrically coupled to the first and second transfer transistors by the vias. In some embodiments, the method further includes etching back the second polysilicon layer between the deposing of the second polysilicon layer and the performing of the third selective etch. In some embodiments, the first and second transfer transistors are on a frontside of the first semiconductor substrate, wherein the method further includes: performing a second selective etch into a backside of the first semiconductor substrate to form a trench extending completely through the first semiconductor substrate, wherein the trench is directly over the readout transistor; and filling the trench with a dielectric material. In some embodiments, the forming of the first transfer transistor includes: performing a second selective etch into the first semiconductor substrate to form a trench extending into the first photodetector; depositing a conductive layer covering the first semiconductor substrate and filling the trench; and performing a third selective etch into the conductive layer to form vertical transfer gate electrode in the trench.

In some embodiments, the present application further provides a readout method for an image sensor, wherein the method includes: providing an image sensor including: a semiconductor substrate including a bulk region and a floating node over the bulk region; a photodetector in the semiconductor substrate; a transfer transistor overlying the photodetector; a semiconductor mesa spaced over the semiconductor substrate; and a reset transistor on the semiconductor mesa and electrically coupled to the floating node, wherein the semiconductor mesa is between the reset transistor and the semiconductor substrate; clearing charge from the photodetector and the floating node using the transfer and reset transistors, wherein the bulk region is biased at about 0 volts during the clearing; and transferring charge accumulated in the photodetector to the floating node while the bulk region is biased at a negative voltage, wherein the transferring includes setting the transfer transistor to an ON state while the reset transistor is in an OFF state. In some embodiments, the biasing of the bulk region transitions from about 0 volts to the negative voltage at a start of the transferring and transitions from the negative voltage to about 0 volts at an end of the transferring. In some embodiments, the clearing includes: performing a first clearing process to clear charge from the photodetector, wherein the first clearing process includes setting the transfer and reset transistors to ON states; and performing a second clearing process after the first clearing process to clear charge from the floating node, wherein the second clearing process includes setting the reset transistor to an ON state while the transfer transistor is in an OFF state. In some embodiments, the transfer and reset transistors respectively include a transfer gate electrode and a reset gate electrode, wherein the transfer transistor is set to an ON state by biasing the transfer gate electrode with a first gate-source voltage having a first polarity, and wherein the reset transistor is set to the ON state by biasing the reset gate electrode with a second gate-source voltage having a second polarity that is opposite the first polarity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a semiconductor substrate comprising a floating node and a collector region;
   a photodetector in the semiconductor substrate, wherein the photodetector is defined in part by the collector region;
   a transfer transistor over the semiconductor substrate, wherein the collector region and the floating node respectively define source/drain regions of the transfer transistor;
   a semiconductor mesa over and spaced from the semiconductor substrate;
   a readout transistor on and partially defined by the semiconductor mesa, wherein the semiconductor mesa is between the readout transistor and the semiconductor substrate; and
   a via extending from the floating node and electrically coupled to the readout transistor.

2. The integrated chip according to claim 1, wherein the transfer transistor is an N-channel field-effect transistor (FET), and wherein the readout transistor is a P-channel FET.

3. The integrated chip according to claim 1, wherein the readout transistor comprises a gate electrode, and wherein the via extends from the floating node to the gate electrode.

4. The integrated chip according to claim 1, further comprising:
   a trench isolation structure extending completely through the semiconductor substrate, wherein the semiconductor mesa is directly over the trench isolation structure.

5. The integrated chip according to claim 1, wherein the collector region is completely spaced below a top surface of the semiconductor substrate, wherein the transfer transistor comprises a gate electrode having a protrusion protruding into the semiconductor substrate, and wherein the collector region wraps around a bottom of the protrusion.

6. The integrated chip according to claim 1, wherein the via comprises doped polysilicon.

7. The integrated chip according to claim 1, wherein the readout transistor comprises a gate electrode, and wherein the integrated chip further comprises:
   an interconnect structure comprising a plurality of wires and a plurality of vias that are stacked over the semiconductor substrate and the semiconductor mesa, wherein the plurality of vias comprises the via and a second via, wherein the plurality of wires comprises a wire, and wherein the via and the second via extend from the wire respectively to the floating node and the gate electrode.

8. The integrated chip according to claim 1, further comprising:
   a second semiconductor mesa over and spaced from the semiconductor substrate and at a same level above the semiconductor substrate as the semiconductor mesa; and
   a second via extending from the semiconductor substrate to the second semiconductor mesa, wherein the second via comprises a semiconductor material.

9. The integrated chip according to claim 1, further comprising:
   a second readout transistor on and partially defined by the semiconductor mesa, wherein the readout transistor and the second readout transistor share a common source/drain region in the semiconductor mesa.

10. The integrated chip according to claim 1, wherein the readout transistor comprises a gate electrode to which the via extends, and wherein the integrated chip further comprises:
    a second semiconductor mesa over and spaced from the semiconductor substrate, wherein the semiconductor mesa and the second semiconductor mesa are laterally elongated respectively in orthogonal directions; and
    a second readout transistor on and partially defined by the second semiconductor mesa, wherein the second readout transistor comprises a source/drain region electrically coupled to the floating node.

11. An integrated chip comprising:
    a semiconductor substrate;
    a pair of photodetectors in the semiconductor substrate;
    a pair of transfer transistors over and partially defined by the semiconductor substrate, wherein the transfer transistors respectively overlie the photodetectors and are electrically coupled respectively to the photodetectors;
    a semiconductor mesa elevated above the semiconductor substrate and laterally between the photodetectors;
    a readout transistor on and partially defined by the semiconductor mesa, wherein the readout transistor comprises a gate electrode, and wherein the gate electrode overlies each of the photodetectors; and
    a pair of vias, wherein the vias extend to the readout transistor respectively from the transfer transistors.

12. The integrated chip of claim 11, wherein the gate electrode wraps around the semiconductor mesa from a first sidewall of the semiconductor mesa to a second sidewall of the semiconductor mesa.

13. The integrated chip of claim 11, further comprising:
    a pair of additional photodetectors in the semiconductor substrate, wherein the gate electrode overlies each of the additional photodetectors.

14. The integrated chip of claim 11, further comprising:
    a trench isolation structure extending into the semiconductor substrate on an opposite side of the semiconductor substrate as the semiconductor mesa, wherein the trench isolation structure directly underlies the semiconductor mesa and laterally separates the photodetectors from each other.

15. The integrated chip of claim 11, wherein the semiconductor mesa has a line-shaped top layout that is elongated along a boundary between the photodetectors.

16. The integrated chip of claim 11, further comprising:
    an additional readout transistor over and partially defined by the semiconductor mesa, wherein the additional readout transistor straddles a boundary between the photodetectors.

17. An integrated chip comprising:
    a semiconductor substrate;
    a photodetector in the semiconductor substrate, wherein the photodetector comprises a collector region buried in the semiconductor substrate;
    a floating node in the semiconductor substrate, wherein the floating node is over and spaced from the collector region;
    a transfer transistor over and partially defined by the semiconductor substrate, wherein the floating node defines a source/drain region of the transfer transistor, and wherein the transfer transistor comprises a gate electrode having a protrusion protruding into the collector region;
    a first semiconductor mesa and a second semiconductor mesa elevated relative to the transfer transistor, wherein the first and second semiconductor mesas border and are laterally elongated respectively in orthogonal directions;
a first readout transistor and a second readout transistor over and partially defined respectively by the first and second semiconductor mesas; and
a via extending from the floating node to the first readout transistor.

18. The integrated chip of claim 17, wherein the second readout transistor comprises a pair of surfaces facing the transfer transistor, and wherein the surfaces are laterally offset in a direction along which the first semiconductor mesa is elongated.

19. The integrated chip of claim 17, further comprising:
a trench isolation structure extending into the semiconductor substrate on an opposite side of the semiconductor substrate as the first and second semiconductor mesas, wherein the trench isolation structure underlies the transfer transistor.

20. The integrated chip of claim 17, further comprising:
a third semiconductor mesa elevated relative to the transfer transistor, wherein the third semiconductor mesa is line-shaped and elongated orthogonal to an axis along which the first semiconductor mesa is elongated, and wherein the third semiconductor mesa is on an opposite side of the first semiconductor mesa as the second semiconductor mesa; and
a third readout transistor on and partially defined by the third semiconductor mesa, wherein a top layout of the third readout transistor is a mirror image of a top layout of the second readout transistor about the axis.

* * * * *